United States Patent
Wong et al.

(10) Patent No.: US 8,222,646 B2
(45) Date of Patent: Jul. 17, 2012

(54) THIN-FILM TRANSISTORS WITH METAL SOURCE AND DRAIN AND METHODS OF FABRICATION

(75) Inventors: Man Wong, Sai Kung (HK); Hoi Sing Kwok, Kowloon (HK); Dongli Zhang, Kowloon (HK)

(73) Assignee: The Hong Kong University of Science and Technology, Hong Kong (HK)

(*) Notice: Subject to any disclaimer, the term of this patent is extended or adjusted under 35 U.S.C. 154(b) by 359 days.

(21) Appl. No.: 11/474,665

(22) Filed: Jun. 26, 2006

(65) Prior Publication Data

US 2007/0007530 A1    Jan. 11, 2007

Related U.S. Application Data

(60) Provisional application No. 60/697,263, filed on Jul. 8, 2005.

(51) Int. Cl.
*H01L 29/10* (2006.01)
*H01L 27/01* (2006.01)

(52) U.S. Cl. .......................................... 257/66; 257/347
(58) Field of Classification Search ................. 257/283, 257/66, 347, 902, E21.413, E29.147, E29.151
See application file for complete search history.

(56) References Cited

U.S. PATENT DOCUMENTS

| | | | |
|---|---|---|---|
| 6,100,954 A * | 8/2000 | Kim et al. | 349/138 |
| 6,555,879 B1 | 4/2003 | Krivokapic et al. | |
| 2002/0074548 A1* | 6/2002 | Lee et al. | 257/59 |
| 2002/0182828 A1* | 12/2002 | Asami et al. | 438/485 |
| 2003/0025127 A1* | 2/2003 | Yanai et al. | 257/158 |
| 2003/0132482 A1* | 7/2003 | Miyazaki et al. | 257/347 |
| 2004/0110329 A1* | 6/2004 | Joo et al. | 438/166 |
| 2004/0232495 A1* | 11/2004 | Saito et al. | 257/382 |
| 2004/0263704 A1* | 12/2004 | Oh et al. | 349/43 |
| 2005/0104152 A1 | 5/2005 | Snyder et al. | |
| 2006/0094172 A1* | 5/2006 | Lee et al. | 438/149 |
| 2006/0240668 A1* | 10/2006 | Rudin | 438/678 |

* cited by examiner

*Primary Examiner* — Hung Vu
(74) *Attorney, Agent, or Firm* — Leydig, Voit & Mayer, Ltd.

(57) ABSTRACT

A thin-film transistor includes a source and a drain that have each been replaced with a metal by a heat-treatment at a temperature within the range of 250° C. and 500° C.

15 Claims, 75 Drawing Sheets

THIN-FILM TRANSISTORS WITH METAL SOURCE AND DRAIN AND METHODS OF FABRICATION

CROSS-REFERENCE TO RELATED APPLICATIONS

This application claims the benefit of U.S. Provisional Application No. 60/697,263, filed Jul. 8, 2005, the entire contents of which are herein incorporated by reference.

FIELD OF THE INVENTION

The present invention relates to thin-film transistors, and more particularly to thin-film transistors with metal source and drain and methods for fabricating the same.

BACKGROUND OF THE INVENTION

The thin-film transistor (TFT) is a type of field-effect transistor whose layers are formed from thin films deposited on a substrate. TFTs have many useful and popular applications such as active-matrix liquid-crystal displays (LCDs) and 3-dimensional integrated circuits.

TFTs are typically formed by depositing an insulator on a substrate layer. A thin-film semiconducting layer is deposited onto the insulating layer. Source and drain regions are formed within the semiconducting layer by doping either p- or n-type impurities depending on the type of TFT being formed. A typical TFT has a gate-modulated channel region located between the source and drain regions.

As with other implementations of metal-oxide-semiconductor field-effect transistors (MOSFETs), of which TFTs are an example, TFTs generally incorporate n- or p-type impurities, such as phosphorus or boron respectively, into the source and drain regions of a transistor by implantation or diffusion. Because of the need to activate implanted impurities and to tailor the depth of implanted or diffused junctions, a high-temperature annealing step is generally required subsequent to the introduction of the impurities.

Advanced TFT devices such as those used in advanced displays, generally require a continued reduction in the TFT channel length and the active island thickness of a TFT. Moreover, advanced TFT devices demand enhanced TFT performance such as high on-state current for providing high contrast ratio and high switching speed, particularly for displays based on organic light-emitting diodes. As the channel length and active island thickness are reduced, device performance is increasingly degraded by the source and drain parasitic resistance.

The problem of high source/drain resistance is further aggravated in thin-film transistors with ultra-thin active layers, which are typically implemented to achieve better gate-control for reduced short-channel effects. For polycrystalline silicon based TFTs fabricated on low-temperature glass substrates for display applications, the parasitic resistance is aggravated by the necessity to maintain a relatively low temperature of activation and the trapping of carriers in grain boundaries.

In addition to displays, advanced TFTs may be used for the realization of high-performance scaled transistors, particularly those based on thin-film type silicon-on-insulator substrates or narrow thin-film type structures such as FINFETs. The accompanying high source and drain parasitic resistance, if not alleviated, would degrade the performance of the resulting integrated circuits.

Various techniques have been employed to minimize source and drain resistance. For example, the source and drain regions may undergo silicidation or thickening. While such techniques have been effective at lowering source and drain resistance, these techniques result in increased process complexity and increased manufacturing cost.

Two popular ways of forming a MOSFET with raised source and drain regions are the selective epitaxial growth and the deposition of silicon. After the formation of doped source/drain regions, gate-edge spacers are formed. Selective epitaxial growth or selective deposition is used to form a raised silicon structure on the source and drain regions. Selectivity is typically difficult to control and requires expensive equipment.

Techniques in the related art have sought to lower source and drain resistance by using metallic source and drain electrodes. For example, U.S. Patent Application Publication No. 2005/0104152 (Snyder) uses metal silicides to form Schottky barrier or Schottky-like contacts to the semiconductor substrate. This metal silicidation process lacks the desired performance characteristics and simplicity of process. Moreover, silicidation techniques typically require an activation temperature above 500° C. and after the silicidation, any remaining unreacted metal must be removed.

Additionally, U.S. Pat. No. 6,555,879 (Krivokapic) relates to the use of metal with the source and drain. However, Krivokapic, like Snyder, uses an undesirable metal silicidation process. Thus, a more effective and simpler method for reducing source and drain resistance is desired.

Accordingly, there is a strong demand for TFTs with low source and drain resistance, and preferably fabricated at a temperature below 500° C. and compatible with inexpensive glass substrates.

SUMMARY OF THE INVENTION

The invention provides a thin-film transistor that includes a source and a drain that have each been replaced with a metal by a heat treatment at a temperature within the range of about 250° C. to about 500° C.

The invention further provides a thin-film transistor that includes a substrate. A first insulating layer is disposed on the substrate. A semiconductor island layer is disposed over a portion of the insulating layer and includes doped, or undoped, source and drain regions that have been replaced by metal by a low-temperature heat-treatment. A gate dielectric layer is disposed on the semiconductor island layer and the insulating layer having replacement windows thereon for providing access to the semiconductor island layer. A gate electrode is disposed on a portion of the gate dielectric layer. A second insulating layer is disposed on the gate dielectric layer and the gate electrode. The second insulating layer has replacement windows aligning with the replacement windows of the gate dielectric layer for providing access to the semiconductor island layer and a replacement window for providing access to the gate electrode. A source metal electrode is disposed on a portion of the second insulating layer and in electrical contact with the source. A drain metal electrode is disposed on a portion of the second insulating layer and in electrical contact with the drain. A gate metal electrode is disposed on a portion of the second insulating layer and in electrical contact with the gate electrode.

The invention also provides a thin-film transistor that includes a substrate, with an insulating layer disposed on the substrate. A semiconductor island layer is disposed over a portion of the insulating layer and includes source and drain regions that have been replaced by metal by a low-temperature heat-treatment. A gate dielectric layer is disposed on the semiconductor island layer and the insulating layer having replacement windows thereon for providing access to the semiconductor island layer. A metal gate electrode is disposed on a portion of the gate dielectric layer. A source metal electrode is disposed on a portion of the gate dielectric layer and in electrical contact with the source. A drain metal electrode is disposed on a portion of the gate dielectric layer and in electrical contact with the drain.

The invention further provides a thin-film transistor that includes a substrate, an insulating layer disposed on the substrate, a semiconductor island layer disposed over a portion of the insulating layer. The semiconductor island includes a source region, a first doped region proximate to the source region, a drain region, and a second doped region proximate to the drain region. The source region, a portion of the first doped region, the drain region, and a portion of the second doped region have been replaced by metal by a low-temperature heat-treatment. A gate dielectric layer is disposed on the semiconductor island layer and the insulating layer having replacement windows thereon for providing access to the semiconductor island layer. A metal gate electrode is disposed on a portion of the gate dielectric layer. A source metal electrode disposed on a portion of the gate dielectric layer and in electrical contact with the source. A drain metal electrode disposed on a portion of the gate dielectric layer and in electrical contact with the drain.

The invention further provides a method for fabricating a thin-film transistor, which comprises replacing a source and a drain with a metal by a heat-treatment at a temperature within the range of 250° C. and 500° C.

In the present invention, the method for fabricating a thin-film transistor includes providing a first insulating layer on the top surface of a substrate, and a semiconductor island layer on a portion of the top surface of the first insulating layer. A gate dielectric layer is provided on the top surface of the semiconductor island and on a portion of the top surface of the first insulating layer not covered by the semiconductor island. A gate electrode is provided on a portion of the top surface of the gate dielectric layer. Impurities are provided, by self-aligned introduction, into the source and drain regions of the semiconductor layer. A second insulating layer is provided on the top surface of the gate electrode and on a portion of the top surface of the gate dielectric layer not covered by the gate electrode. Replacement windows are opened through the second insulating layer and the gate dielectric layer to expose a portion of the gate electrode, source, and drain. A bottom metal layer is provided on the top surface of the second insulating layer and through the replacement windows such that the bottom metal layer is in electrical contact with the gate electrode, source, and drain. A top metal layer is optionally provided on the top surface of the bottom metal layer. A low-temperature heat-treatment process is performed to replace portions of the source and drain with metal from the bottom metal layer. The bottom metal layer is patterned into interconnects to provide electrical access to the source, drain, and gate.

The invention further provides a method for fabricating a thin-film transistor which includes providing a first insulating layer on the top surface of a substrate, and a semiconductor island layer on a portion of the top surface of the first insulating layer. A gate dielectric layer is provided on the top surface of the semiconductor island and on a portion of the top surface of the first insulating layer not covered by the semiconductor island. A gate electrode is provided on a portion of the top surface of the gate dielectric layer. Impurities are provided, by self-aligned introduction, into the source and drain regions of the semiconductor layer. A second insulating layer is provided on the top surface of the gate electrode and on a portion of the top surface of the gate dielectric layer not covered by the gate electrode.

Replacement windows are opened through the second insulating layer and the gate dielectric layer to expose a portion of the gate electrode, source, and drain. A bottom metal layer is provided on the top surface of the second insulating layer and through the replacement windows such that the bottom metal layer is in electrical contact with the gate electrode, source, and drain. A top metal layer is optionally provided on the top surface of the bottom metal layer. A low-temperature heat-treatment process is performed to replace the source and drain with metal from the bottom metal layer with small doped regions formed beyond to the metal source and drain. The bottom metal layer is patterned into interconnects to provide electrical access to the source, drain, and gate.

The invention further provides a method for fabricating a thin-film transistor which includes providing a first insulating layer on the top surface of a substrate. A semiconductor island layer is provided on a portion of the top surface of the first insulating layer. A gate dielectric layer is provided on the top surface of the semiconductor island and on a portion of the top surface of the first insulating layer not covered by the semiconductor island. A gate electrode is provided on a portion of the top surface of the gate dielectric layer. A second insulating layer is provided on the top surface of the gate electrode and on a portion of the top surface of the gate dielectric layer not covered by the gate electrode.

Replacement windows are opened through the second insulating layer and the gate dielectric layer to expose a portion of the gate electrode, a portion of the semiconductor island layer where a source may be formed, and a portion of the semiconductor island layer where a drain may be formed. A bottom metal layer is provided on the top surface of the second insulating layer and through the replacement windows such that the bottom metal layer is in electrical contact with the gate electrode, source portion, and drain portion. A top metal layer is optionally provided on the top surface of the bottom metal layer. A low-temperature heat-treatment process is performed to replace the source portion and drain portion of the semiconductor island layer with metal from the bottom metal layer. The bottom metal layer is patterned into interconnects to provide electrical access to the source, drain, and gate.

The invention likewise provides a method for fabricating a thin-film transistor which includes providing a first insulating layer on the top surface of a substrate. A semiconductor island layer is provided on a portion of the top surface of the first insulating layer. A gate dielectric layer is provided on the top surface of the semiconductor island and on a portion of the top surface of the first insulating layer not covered by the semiconductor island. A gate electrode is provided on a portion of the top surface of the gate dielectric layer. A second insulating layer is provided on the top surface of the gate electrode and on a portion of the top surface of the gate dielectric layer not covered by the gate electrode.

Replacement windows are opened through the second insulating layer and the gate dielectric layer to expose a portion of the gate electrode, a portion of the semiconductor island layer where a source may be formed, and a portion of the semiconductor island layer where a drain may be formed. A bottom metal layer is provided on the top surface of the second insulating layer and through the replacement windows such that the bottom metal layer is in electrical contact with the gate electrode, source portion, and drain portion. A top metal layer is optionally provided on the top surface of the bottom metal layer. A low-temperature heat-treatment process is performed to replace the source portion and drain portion of the semiconductor island layer with metal from the bottom metal layer. The bottom metal layer is patterned into interconnects to provide electrical access to the source, drain, and gate. Impurities are provided, by self-aligned introduction, into a first selected region and a second selected region. A second low-temperature heat-treatment process is performed and small doped regions are formed beyond to the metal source and drain.

The invention further provides a method for fabricating a thin-film transistor, which includes providing an insulating layer on the top surface of a substrate. A semiconductor island layer is provided on a portion of the top surface of the insulating layer. A gate dielectric layer is provided on the top surface of the semiconductor island and on a portion of the top surface of the insulating layer not covered by the semiconductor island. Replacement windows are opened through the gate dielectric layer to expose a portion of the semiconductor island layer where a source may be formed, and a portion of the semiconductor island layer where a drain may be formed. A bottom metal layer is provided on the top surface of the gate dielectric layer and through the replacement windows such that the bottom metal layer is in electrical contact with the source portion and drain portion. A top metal layer is optionally provided on the top surface of the bottom metal layer. A low-temperature heat-treatment process is performed to replace the source portion and drain portion of the semiconductor island layer with metal from the bottom metal layer. The bottom metal layer is patterned into interconnects forming a gate electrode and providing electrical access to the source and drain.

The invention additionally provides a method for fabricating a thin-film transistor, which includes providing an insulating layer on the top surface of a substrate. A semiconductor island layer is provided on a portion of the top surface of the insulating layer. A gate dielectric layer is provided on the top surface of the semiconductor island and on a portion of the top surface of the insulating layer not covered by the semiconductor island. Replacement windows are opened through the gate dielectric layer to expose a portion of the semiconductor island layer where a source may be formed, and a portion of the semiconductor island layer where a drain may be formed. A bottom metal layer is provided on the top surface of the gate dielectric layer and through the replacement windows such that the bottom metal layer is in electrical contact with the source portion and drain portion. A top metal layer is optionally provided on the top surface of the bottom metal layer. The bottom and top metal layers are patterned into interconnects forming a gate electrode and providing electrical access to the source and drain portions of the semiconductor island layer. Impurities are provided, by self-aligned introduction, into a first selected region and a second selected region. A low-temperature heat-treatment process is performed to replace the source portion and drain portion of the semiconductor island layer along with a portion of the first selected region and a portion of the second selected region with metal from the bottom metal layer.

The invention additionally provides a method for fabricating a thin-film transistor, which includes providing an insulating layer on the top surface of a substrate. A semiconductor island layer is provided on a portion of the top surface of the insulating layer. A gate dielectric layer is provided on the top surface of the semiconductor island and on a portion of the top surface of the insulating layer not covered by the semiconductor island. Replacement windows are opened through the gate dielectric layer to expose a portion of the semiconductor island layer where a source may be formed, and a portion of the semiconductor island layer where a drain may be formed.

A bottom metal layer is provided on the top surface of the gate dielectric layer and through the replacement windows such that the bottom metal layer is in electrical contact with the source portion and drain portion. A top metal layer is optionally provided on the top surface of the bottom metal layer. The bottom and top metal layers are patterned into interconnects forming a gate electrode and providing electrical access to the source and drain portions of the semiconductor island layer. Impurities are provided, by self-aligned introduction, into a first selected region and a second selected region. A low-temperature heat-treatment process is performed to replace the source portion and drain portion of the semiconductor island layer along with the first selected region and a portion of the second selected region with metal from the bottom metal layer with small doped regions formed beyond to the metal source and drain.

The invention likewise provides a method for fabricating a thin-film transistor, which includes providing an insulating layer on the top surface of a substrate. A semiconductor island layer is provided on a portion of the top surface of the insulating layer. A gate dielectric layer is provided on the top surface of the semiconductor island and on a portion of the top surface of the insulating layer not covered by the semiconductor island. Replacement windows are opened through the gate dielectric layer to expose a portion of the semiconductor island layer where a source may be formed, and a portion of the semiconductor island layer where a drain may be formed.

A bottom metal layer is provided on the top surface of the gate dielectric layer and through the replacement windows such that the bottom metal layer is in electrical contact with the source portion and drain portion. A top metal layer is optionally provided on the top surface of the bottom metal layer. A first low-temperature heat-treatment process is performed to replace the source portion and drain portion of the semiconductor island layer with metal from the bottom metal layer. The bottom metal layer is patterned into interconnects forming a gate electrode and providing electrical access to the source and drain. Impurities are provided, by self-aligned introduction, into a first selected region and a second selected region. A second low-temperature heat-treatment process is performed to form small doped regions beyond to the metal source and drain.

BRIEF DESCRIPTION OF THE DRAWINGS

The above and numerous other objectives, features and advantages that may be achieved by the subject matter of the present invention may be more readily understood from the following detailed description of the preferred embodiments with reference to the accompanying drawings wherein.

vs. $V_{gs}$ and $\tilde{I}_d$ vs. $V_{ds}$ characteristics of MERJ TFTs according to an embodiment of the present invention.

Figure 15:
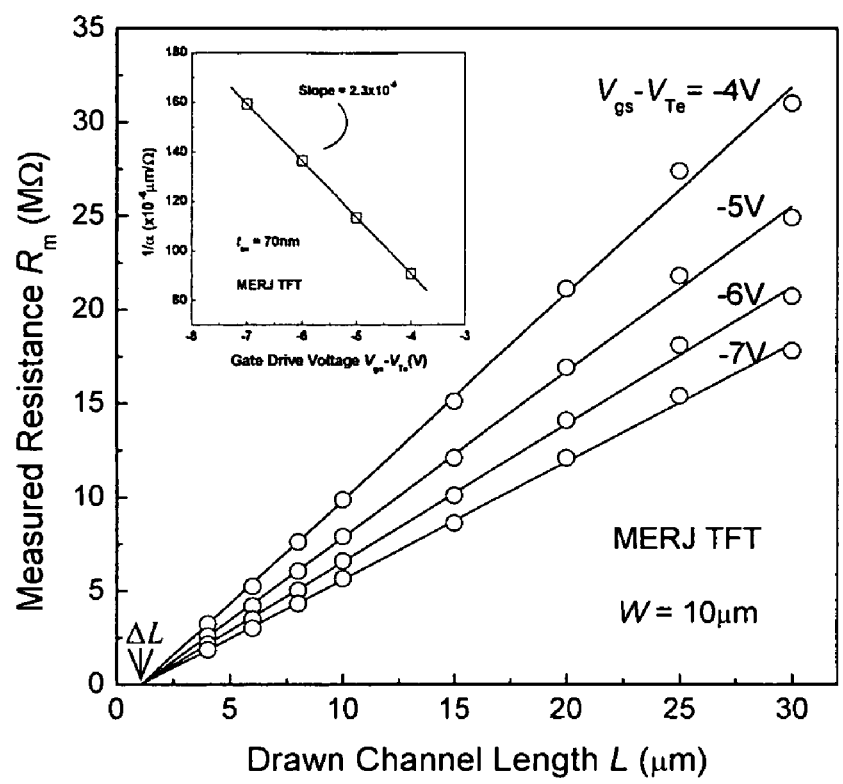

FIG. 15 is a chart illustrating measured resistance as a function of drawn channel length generated using data extracted from the transfer characteristics of a series of MERJ TFTs at $V_{ds}$=−0.05V according to an embodiment of the present invention.

DETAILED DESCRIPTION OF THE INVENTION

Embodiments of the present invention provide for the fabrication of TFTs with low-resistance source and drain regions. These advantages may be achieved without complicating the fabrication process. According to some embodiments of the present invention, the fabrication process of TFTs may be simpler than conventional TFT fabrication techniques.

The low-temperature substitution techniques of the present invention allow for the partial or complete replacement of the source and drain junctions by a metal. This process can be performed at a relatively low temperature between 250 and 500° C. By performing this substitution, the resistivity of the source and drain may be lowered by orders of magnitude.

TFTs with metal-replaced junctions (MERJs), according to embodiments of the present invention, have demonstrated a significantly reduced junction parasitic resistance where the semiconductor source and drain have been partially replaced with a metal. The replacement process was executed at a low temperature of 400° C. with minimum added process complexity. Compared to a TFT with regular semiconductor source and drain junctions, a MERJ TFT was found to exhibit higher effective values of field-effect mobility and on-state current.

In testing the present invention, replacement of poly-Si with aluminum (Al) has been applied to the formation of high-aspect ratio contact plugs and the gate electrode of a metal-oxide-semiconductor transistor. This simple process was used to form a poly-Si TFT with MERJs, leaving only small "pockets" of heavily doped semiconductor contacting the channel. This approach preserves the familiar characteristics of a semiconductor junction; but significantly reduces the parasitic junction resistance because of the much lower resistivity of a metal compared to that of a heavily doped Si. This resulted in a greater recovery of the intrinsic performance of a thin-channel TFT.

Figure 9:
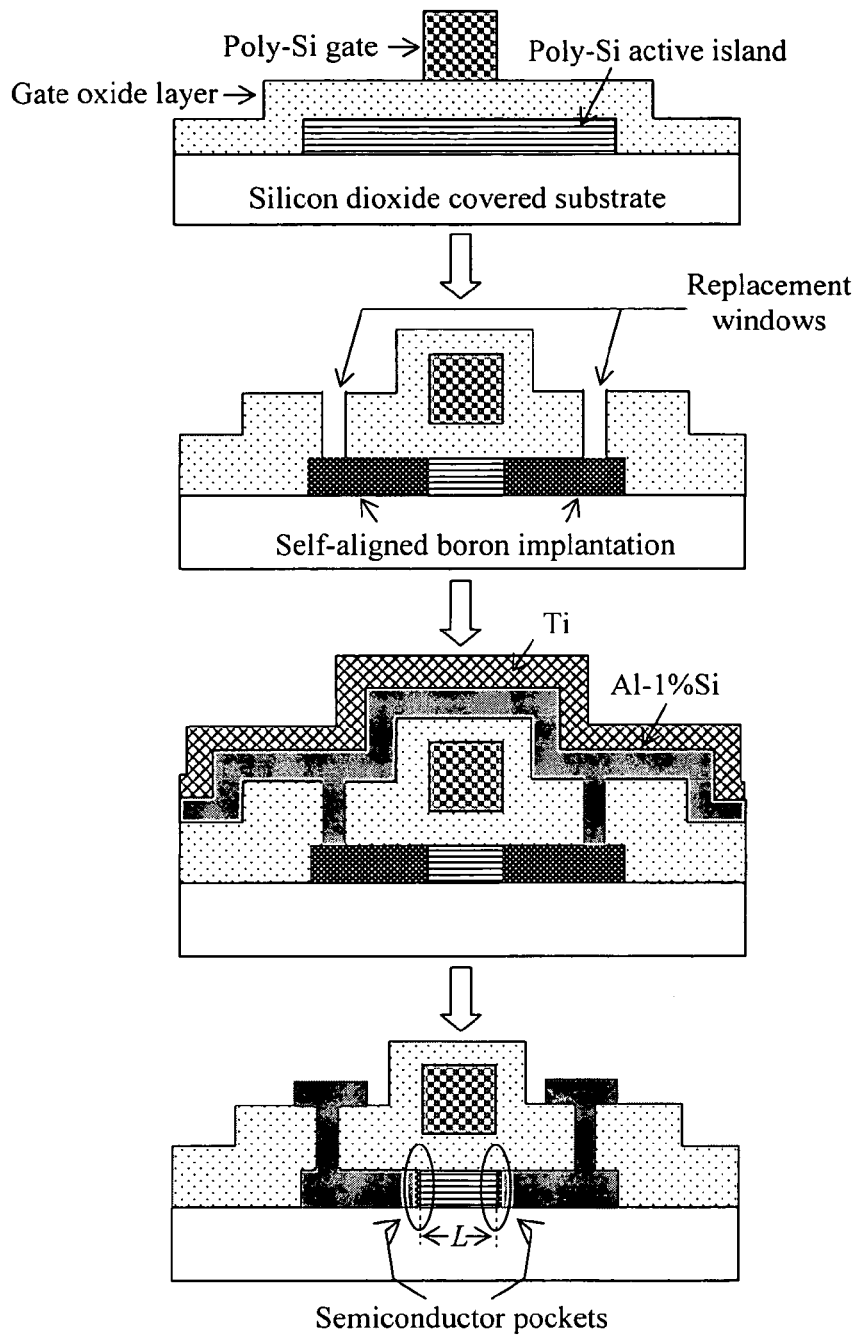
FIG. 9 is a schematic cross sectional view illustrating the evolution of a MERJ TFT during fabrication according to an embodiment of the present invention.

The evolution of the schematic cross-sections of a MERJ TFT during fabrication is shown in FIG. 9. 100 mm-diameter, (100)-oriented silicon wafers covered with 500 nm thermally grown silicon dioxide were used as the starting substrates. Conventional nickel-based metal-induced crystallization (MIC) at 550° C. for 30 hours was used to obtain the 35 nm thick poly-Si active islands. Following the sequential low-pressure chemical vapor depositions (LPCVD) of 90 nm low-temperature oxide (LTO) at 450° C. as the gate dielectric and 220 nm poly-Si at 620° C., the latter was patterned to form the gate electrodes. Self-aligned gate, source and drain doping was accomplished by $4\times10^{15}$ $cm^{-2}$ boron implantation at an energy of 45 KeV. The implanted dopant was activated at 620° C. for 3 hours in atmospheric pressure nitrogen.

Figure 10:
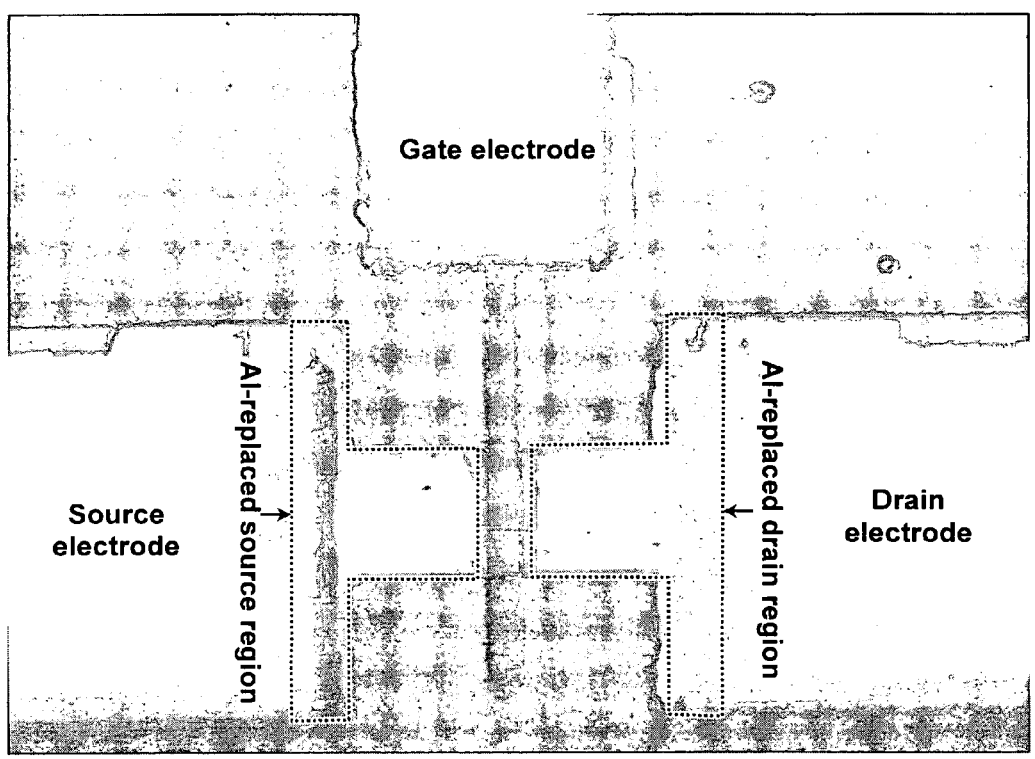
FIG. 10 is a plan view photograph of a fabricated MERJ TFT according to an embodiment of the present invention.

200 nm LTO isolation layer was deposited and the "replacement windows" were opened before 2 μm Al-1% Si alloy and 300 nm titanium (Ti) were sequentially deposited by sputtering. Subsequently, the Ti was selectively removed in concentrated hydrofluoric acid (HF) from some of the active islands. On those islands with the top Ti retained, Al-replacement proceeds laterally from the edge of a replacement window and ~14.5 μm poly-Si was replaced after a heat treatment at 400° C. for 4 hours in atmospheric pressure nitrogen. On the islands with the Ti removed, no replacement was observed and the "control" TFTs were built. All remaining Ti was subsequently removed in HF before the Al layer was patterned to form the interconnects. A plan-view photograph of a fabricated MERJ TFT is shown in FIG. 10, with ~0.5 μm separating the replacement fronts and the edges of the channel.

The measured sheet resistance of the metallic portion of the Al-replaced junction is ~2Ω, corresponding to a resistivity of ~7 μΩ·cm. The latter is about double the intrinsic resistivity of Al but still smaller than those of the commonly used silicides. The contact resistance between an Al-replaced junction and a remaining semiconductor pocket was measured to be ~200 μΩ using a contact chain structure. With a cross-section of ~10 μm by ~35 nm, this corresponds to a specific contact resistivity $\rho_c$ of ~0.7 μΩ·cm² and quite a bit smaller than the ~1.9 μΩ·cm² extracted from a control TFT. A possible reason for the reduced $\rho_c$ could be the "cleaner" Al/Si interface resulting from the replacement process. Using the measured sheet resistance of ~900Ω for the semiconductor junction of a control TFT, one estimates a resistance of ~45Ω for the remaining semiconductor pocket of a MERJ TFT with a channel width W of 10 μm and a channel length L of 2.5 μm. Therefore, the total resistance per junction of a MERJ TFT was ~250Ω. This is less than 25% of the ~1.1 kΩ of a corresponding control TFT.

Figure 11:
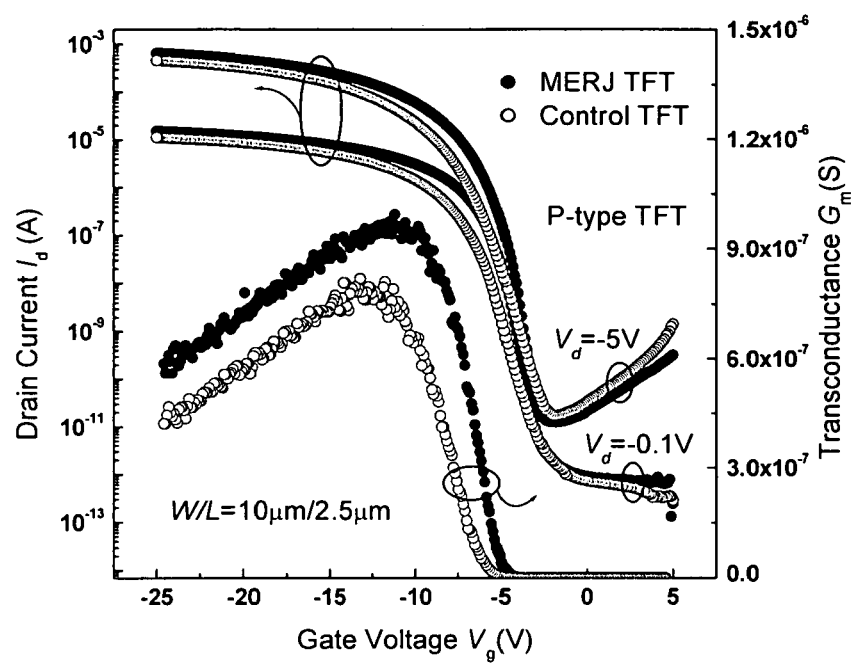
FIG. 11 is a chart illustrating typical drain current $I_d$ vs. terminal gate voltage $V_g$ characteristics of MERJ and control TFTs according to an embodiment of the present invention.

Typical drain current $I_d$ vs. terminal gate voltage $V_g$ characteristics of MERJ and control TFTs are compared in FIG. 11. The effective field-effect mobility $\mu_{FE}$ is extracted from the maximum effective trans-conductance at $$G_m \equiv \frac{\partial I_d}{\partial V_g}$$

at $V_d = -0.1V$. The leakage current $I_{off}$ is defined to be the minimum $I_d$ at a terminal drain voltage $V_d = -5V$; and the on-state current $I_{on}$ is $I_d$ at $V_d = -5V$ and $V_g = -25V$. These effective transistor characteristics are summarized in Table I, where $V_{Te}$ is the linearly extrapolated threshold voltage and S is the sub-threshold swing. Higher effective $I_{on}$ and larger $\mu_{FE}$ are measured on the MERJ TFTs. This is a direct consequence of their smaller junction resistance, hence reduced degradation of the intrinsic characteristics of the TFTs.

TABLE I

|  | MERJ TFT | Control TFT |
|---|---|---|
| $\mu_{FE}$ (cm$^2$/Vs) | 61 ± 4 | 51 ± 4 |
| $V_{Te}$ (V) | −6.6 ± 0.3 | −7.4 ± 0.4 |
| S (V/decade) | 0.5 ± 0.1 | 0.6 ± 0.1 |
| $I_{on}$ (μA/μm) | 64 ± 4 | 48 ± 3 |
| $I_{off}$ (pA/μm) | 0.7 ± 0.5 | 0.5 ± 0.6 |

A poly-Si TFT with Al-replaced junctions for reduced parasitic resistance according to an embodiment of the present invention has been successfully tested. Such junctions are realized by replacing parts of the doped source and drain regions with Al at a low temperature of 400° C. The resistivity of the metallic portion of an Al-replaced junction is ~7 μΩ·cm. The specific contact resistance between an Al-replaced junction and a remaining semiconductor pocket is ~0.7 μΩ·cm$^2$. TFTs with Al-replaced junctions exhibit higher effective field-effect mobility and on-state current.

In testing the present invention, poly-Si TFTs with metallic gate and junctions realized using a 3-mask MERJ technology according to another embodiment of the present invention have been fabricated and characterized. Compared to those of a conventional TFT, the process of making a MERJ TFT is simplified and the resistance of the junctions and gate is reduced. The reduced signal delay on a low-resistance metallic gate line makes the TFT particularly suitable for realizing large-area active-matrix flat-panel displays.

Though most active-matrix flat-panel displays are fabricated using amorphous silicon (a-Si) TFTs because of the simplicity of the technology, the relatively low $\mu_{FE}$ of a-Si TFTs limits their application to only the realization of the pixel switches. Further integration of drivers and other circuits requires TFTs with higher $\mu_{FE}$, such as those based on poly-Si.

In terms of mask-count and process complexity, the construction of circuits based on poly-Si TFTs is comparable to that based on bulk Si transistors and requires a minimum of 4 masking steps. The mask-count is at least 50% higher for circuits containing complementary n- and p-type TFTs. For poly-Si TFTs fabricated on glass, the problem of high junction resistance is aggravated by the reduced dopant activation at the typically low process temperature. High parasitic resistance degrades the apparent performance of a TFT.

Embodiments of the present invention utilize a simple 3-mask MERJ process to realize a poly-Si TFT with metallic gate, source and drain. The low-resistance metallic source and drain junctions allow a significant recovery of the intrinsic characteristics of a MERJ TFT. The signal delay on the long "scan" lines used to drive the rows of the gates of the pixel switch TFTs in an active-matrix panel is roughly proportional to the product of the total line resistance and line capacitance. The reduced delay on a low-resistance metallic gate line makes the MERJ TFTs particularly suitable for realizing large-area active-matrix panels.

Figure 12:
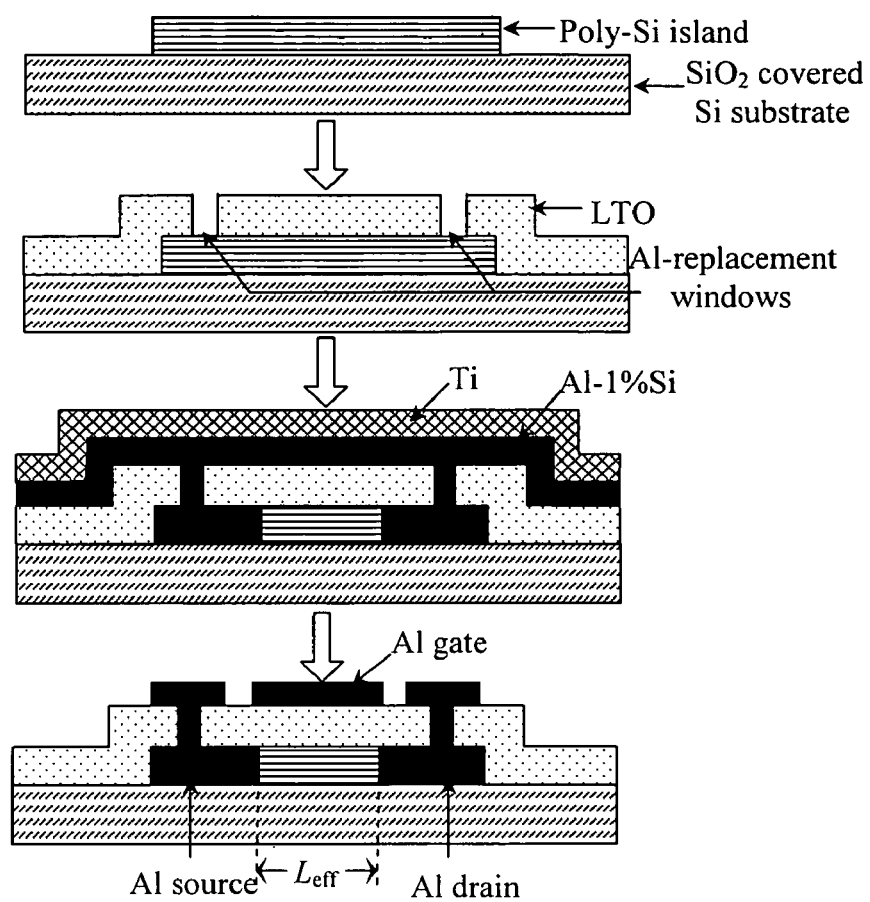
FIG. 12 is a schematic cross section view illustrating the evolution of a MERJ TFT during fabrication according to an embodiment of the present invention.

In testing the present invention, 100 mm-diameter, (100)-oriented Si wafers covered with 500 nm thermally grown Si dioxide were used as the starting substrates. A 35 nm thick a-Si layer was deposited by LPCVD at 550° C. and patterned to form the active islands before the conventional nickel-based MIC at 550° C. was performed. After the deposition of a 70 nm thick LTO at 450° C. as the gate-insulator layer, the Al-replacement windows (FIG. 12) were opened. This was followed by a sequential deposition of a double-layer of 2 μm thick Al-1% Si alloy and 300 nm thick Ti by sputtering.

After a heat-treatment at 400° C. for 2.5 hours in atmospheric-pressure nitrogen, the nominally undoped poly-Si in the vicinity of the replacement windows was replaced by Al at a rate of ~2.5 μm/hr. The replacement Al eventually formed the source and drain junctions of a MERJ TFT. Any remaining Ti was removed in concentrated hydrofluoric acid. Finally, the Al layer was patterned to form the interconnections and the gate electrodes.

The realization of a conventional poly-Si TFT requires at least 4 masks and a heat-treatment step to activate the implanted junctions. With the use of only 3 masks and the elimination of the dopant-activation step, both the complexity and the temperature of making a MERJ TFT are greatly reduced. Similar to the case of the conventional a-Si TFT technology, the source and drain junctions are not self-aligned to the gate electrode. The amount of the mis-alignment between the gate and the junctions is controlled by the overlay accuracy.

The sheet resistance of the resulting Al gate was measured to be ~0.02Ω with a corresponding resistivity of ~4 μΩ·cm that is close to the intrinsic resistivity of Al. The sheet resistance of the Al source and drain of a MERJ TFT is ~2Ω, corresponding to a resistivity of ~7 μΩ·cm that is about double the intrinsic resistivity of Al. Similar increase in resistivity, attributed to the reduced purity of the replacement Al, has been observed. The total parasitic source and drain resistance of a MERJ TFT was ~1.6Ω.

Figure 13:
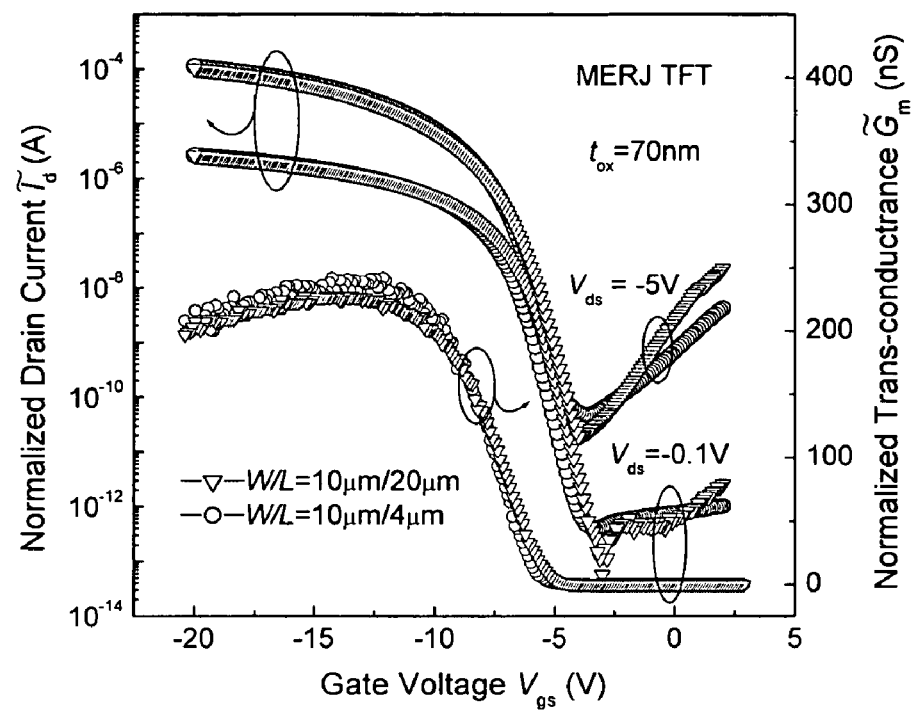
FIGS. 13 and 14 are charts illustrating the respective normalized drain current $$\tilde{I}_d \equiv I_d \frac{L_{eff}}{W}$$
Figure 14:
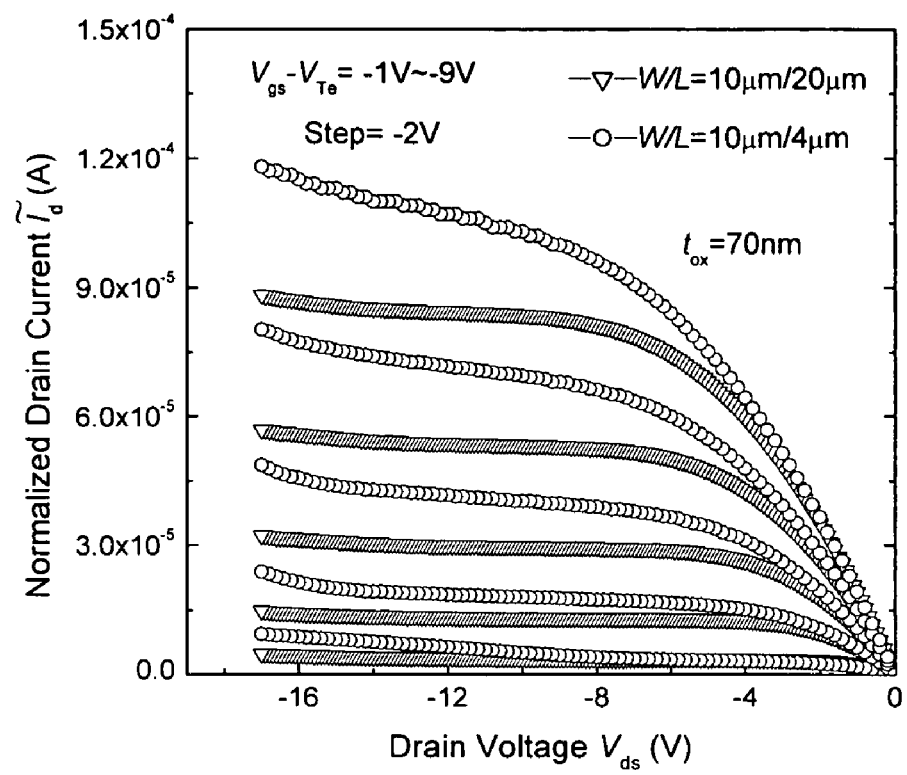

Shown in FIGS. 13 and 14 are the respective normalized drain current $$h_{V_{ds}=-0.1V}\tilde{I}_d \equiv I_d \frac{L_{eff}}{W}$$

vs. $V_{gs}$ and $\tilde{I}_d$ vs. $V_{ds}$ characteristics of MERJ TFTs with drawn channel lengths L of 4 and 20 μm. $I_d$ is the drain current; $V_{gs}$ is the terminal gate-to-source voltage; $V_{ds}$ is the terminal drain-to-source voltage; W is the channel width and $L_{eff}$ is the effective channel length. Because of the diffusion of Al, which is an acceptor in Si, into the channel regions adjacent to the metallic Al junctions, the MERJ TFTs exhibit typical p-channel device characteristics even without any deliberate junction doping.

Obtained from the transfer characteristics of the L=20 μm TFT in FIG. 13 are a linearly extrapolated threshold voltage $V_{Te}$ of ~−8V, a sub-threshold swing of ~0.6V/decade, a minimum leakage current $I_{off}$ of ~10 pA at $V_{ds}$=−5V and an oncurrent ($I_d$ at $V_{gs}=-20V$) to $I_{off}$ ratio of ~$5.5 \times 10^6$ at $V_{ds}=-5V$. From the maximum apparent normalized trans-conductance $$\tilde{G}_m \equiv \frac{\partial \tilde{I}_d}{\partial V_{gs}}\bigg|_{V_{ds}=-0.1V}$$

vs. $V_{gs}$ characteristics in FIG. 11 and without correcting for the parasitic junction resistance, an apparent $\mu_{FE}$ of ~45.5 cm²/Vs is extracted.

FIG. 15 is generated using data extracted from the transfer characteristics of a series of MERJ TFTs at $V_{ds}=-0.05V$. A process-induced channel length reduction $\Delta L \equiv L-L_{eff}$ of ~1.2 µm and an "intrinsic" $\mu_{FE}$ of ~46.3 cm²/Vs can be extracted using techniques known in the art, for example, as outlined in D. L. Zhang and M. Wong, "Effects of trace nickel on the growth kinetics and the electrical characteristics of metal-induced laterally crystallized polycrystalline silicon and devices," *J. of SID.*, vol. 13 (10), pp. 815-822, 2005. The latter is only slightly higher than the apparent $\mu_{FE}$ of ~45.5 cm²/Vs, thus verifying the insignificant impact of the low parasitic junction resistance of ~1.6Ω.

Poly-Si TFTs with metal gate and junctions realized using a simple 3-mask MERJ technology have been fabricated and characterized. The resistance of the gate and the junctions is greatly reduced. The low parasitic junction resistance makes it possible to unmask the intrinsic characteristics of a MERJ TFT.

Based in part on the above described concepts and experimentation, multiple methods for fabricating TFTs with metallic source and drain have been devised and are described in detail below as embodiments of the present invention.

FIGS. 1 and 1A-1H illustrate a method for fabricating a TFT with metallic source and drain according to an embodiment of the present invention.

Figure 1:
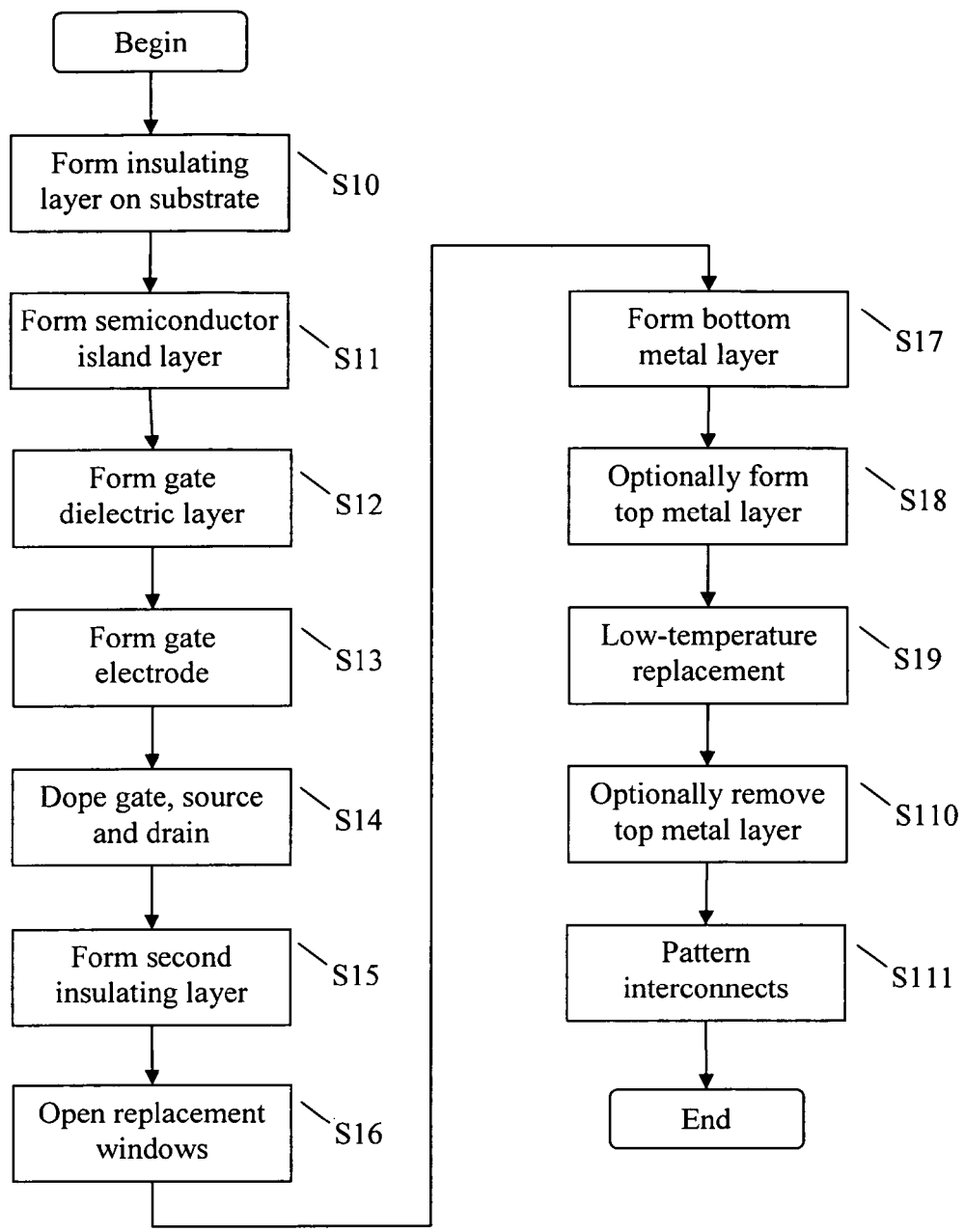
FIGS. 1 and 1A-1H are a flow chart and schematic cross section views illustrating a method for fabricating a TFT with metallic source and drain according to an embodiment of the present invention.
Figure 1A:
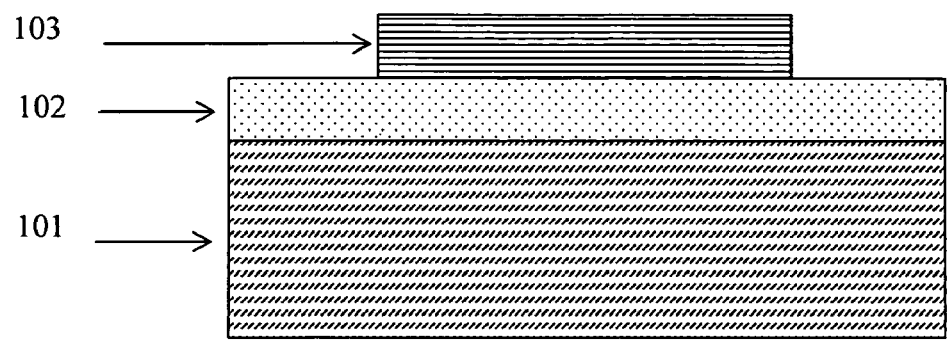

As seen in FIG. 1A, the TFT may be formed on a substrate 101. Examples of suitable substrates include polymer, glass, stainless steel, amorphous silicon, polycrystalline silicon, and single-crystalline silicon optionally containing per-fabricated conventional integrated circuits.

An insulating layer 102 may be formed on the substrate 101 (Step S10). Examples of suitable insulating layers include silicon oxide, silicon oxynitride, silicon nitride, and high dielectric constant (high-k) insulating materials.

A semiconductor island layer 103 may be formed on the insulating layer (Step S11). Examples of suitable semiconductor layers include silicon (Si), silicon-germanium alloy ($Si_xGe_{1-x}$), germanium (Ge) in the amorphous, polycrystalline, or single crystalline state, or combinations of Si $Si_xGe_{1-x}$ or Ge layers in the amorphous, polycrystalline or single crystalline states.

Figure 1B:
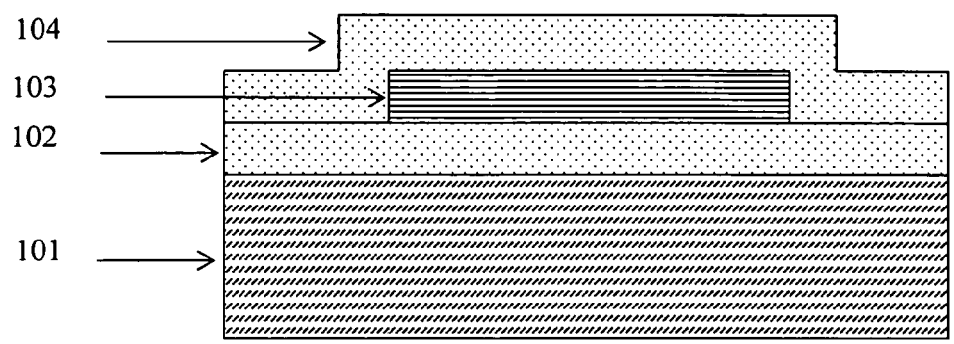

As seen in FIG. 1B, a gate dielectric layer 104 may be formed over the semiconductor island 103 and the insulating layer 102 (Step S12). Examples of a suitable gate dielectric 104 include silicon dioxide, silicon oxynitride, silicon nitride, and high dielectric constant (high-k) insulating materials.

Figure 1C:
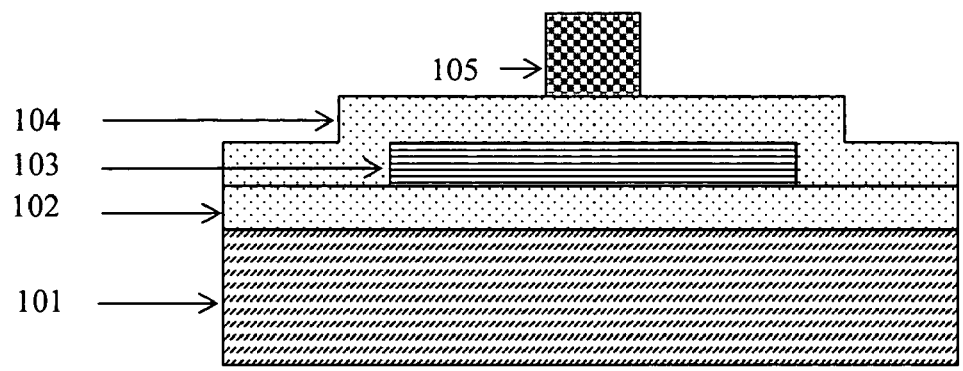

As seen in FIG. 1C, a gate electrode 105 may be formed over the gate dielectric layer 104 (Step S13). Examples of a suitable gate electrode 105 include metal, silicide, semiconductor or layer combinations thereof.

Figure 1D:
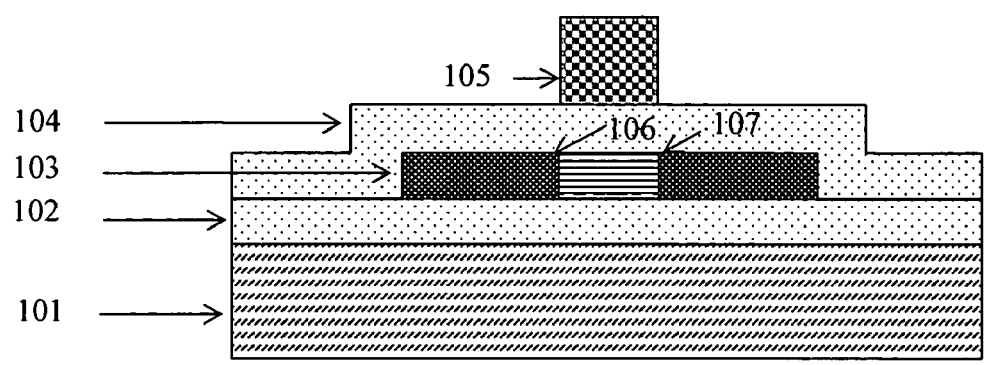

As seen in FIG. 1D, source 106 and drain 107 regions may be formed by self-aligned introduction, such as by ion implantation, of impurities into selected regions of the semiconductor layer 103 (Step S14).

Figure 1E:
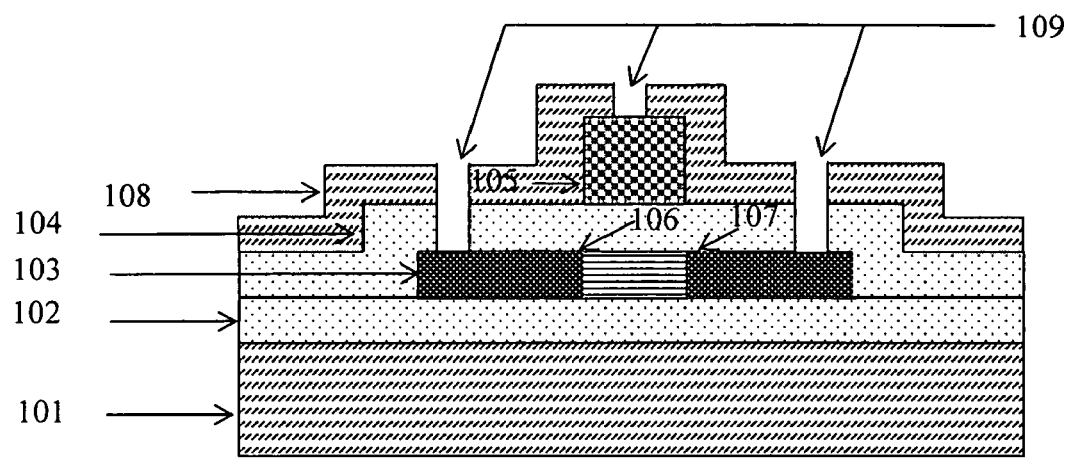

As seen in FIG. 1E, a second insulating layer 108 may be formed over the gate dielectric layer 104 and the gate electrode 105 (Step S15). Replacement windows 109 may then be opened through the second insulating layer 108 and the gate dielectric layer 104 to expose a portion of the gate electrode 105, source 106, and drain 107 (Step S16).

Figure 1F:
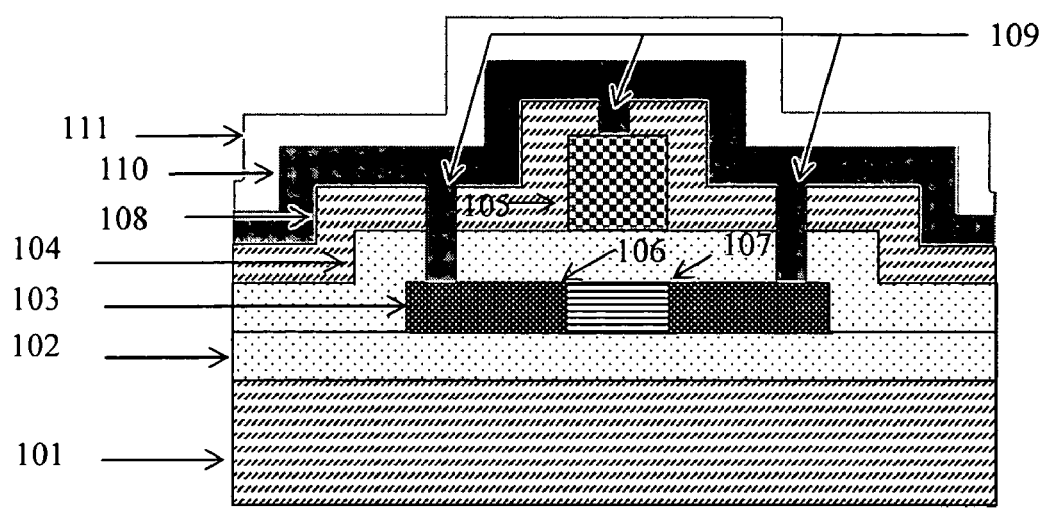

As seen in FIG. 1F, a bottom metal layer 110 may be formed over the second insulating layer 108 and through the replacement windows 109 (Step S17) such that the bottom metal layer 110 is in contact with the source 106, drain 107, and gate 105. A top metal layer 111 may be formed over the bottom metal layer 110 (Step S18). The bottom metal layer may be any suitable metal, for example, aluminum, silver, or gold.

Figure 1G:
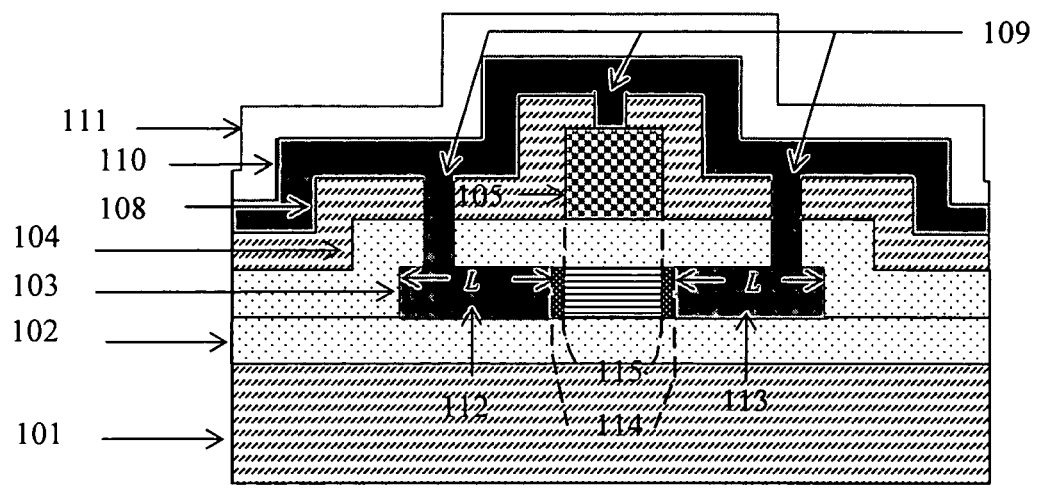

As seen in FIG. 1G, a low-temperature (between 250-500° C.) heat-treatment process is performed wherein parts, but not all, of the semiconductor source 106 and drain 107 are replaced by the bottom metal 110 to form a metallic source 112 and metallic drain 113 (Step S19). The lateral extent (L) of the replacement is controlled by the heat-treatment time. The replacement fronts 114 should not extend to reach the edges of the gate projected downwards 115 (downward projection of edges of gate shown with broken lines).

Figure 1H:
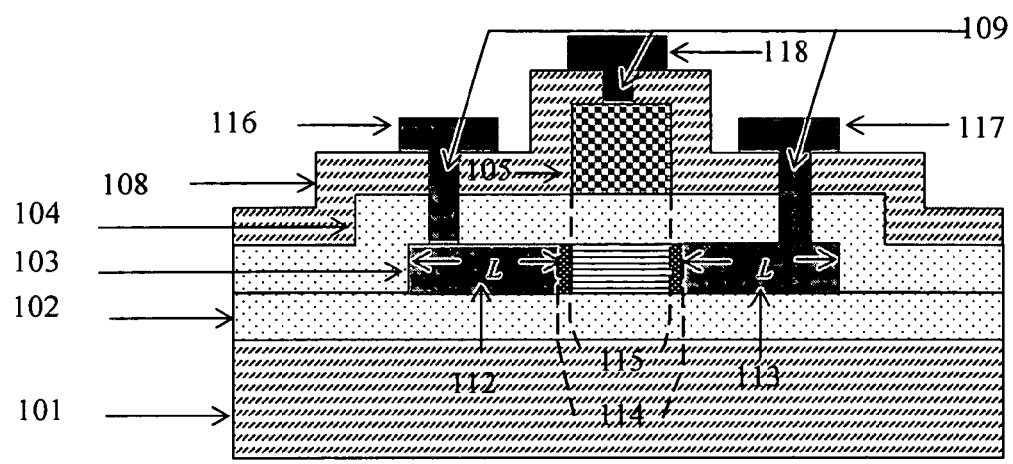

As seen in FIG. 1H, the top metal layer 111 may optionally be removed (Step S110). The remaining bottom metal layer 110 may be patterned into interconnects (Step S111) to provide an electrical access 116 to the metal source 112, an electrical access 117 to the metal drain 113, and an electrical access 118 to the gate 105.

FIGS. 2 and 2A-2H illustrate a method for fabricating a TFT with metallic source and drain according to an embodiment of the present invention.

Figure 2:
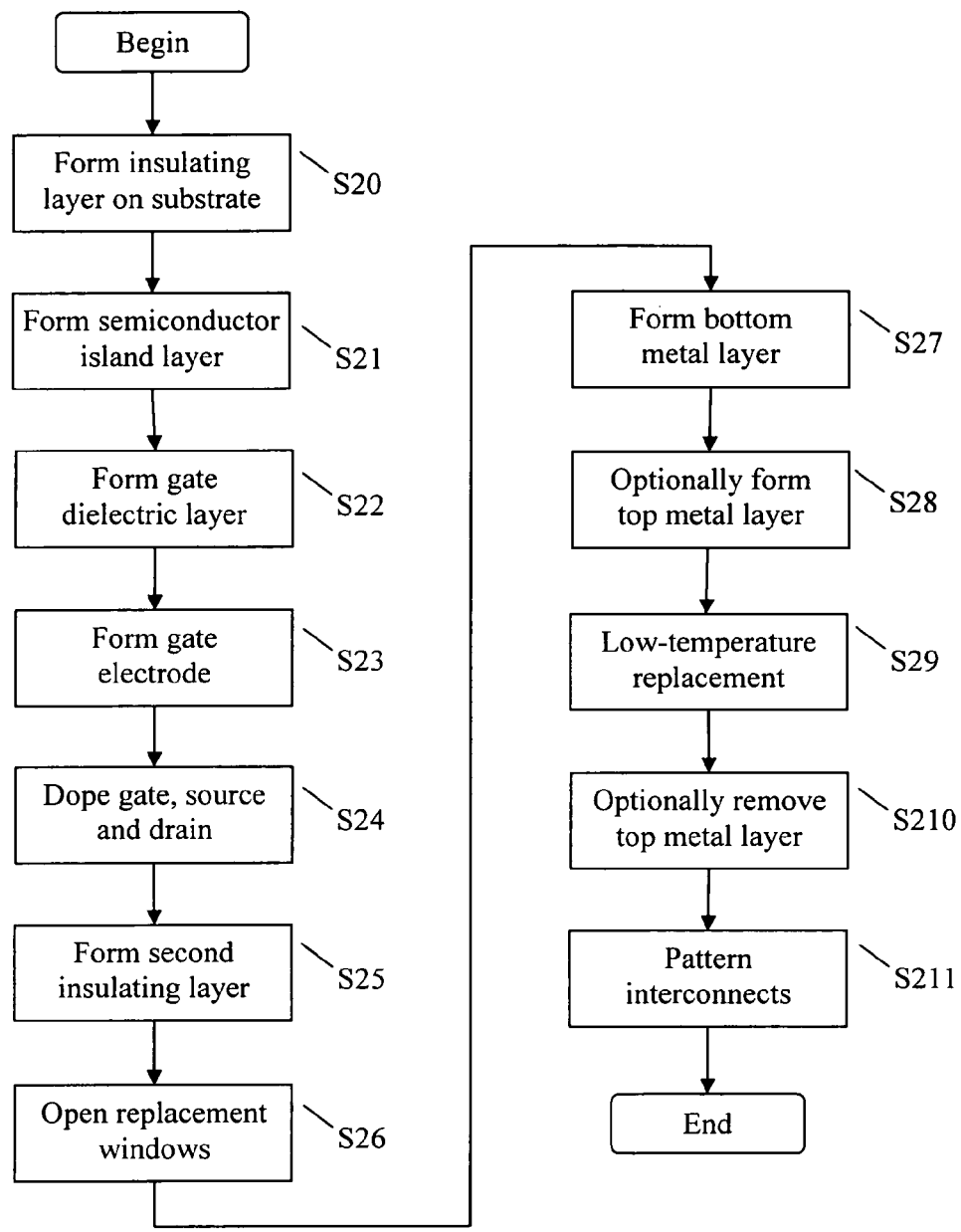
FIGS. 2 and 2A-2H are a flow chart and schematic cross section views illustrating a method for fabricating a TFT with metallic source and drain according to another embodiment of the present invention.
Figure 2A:
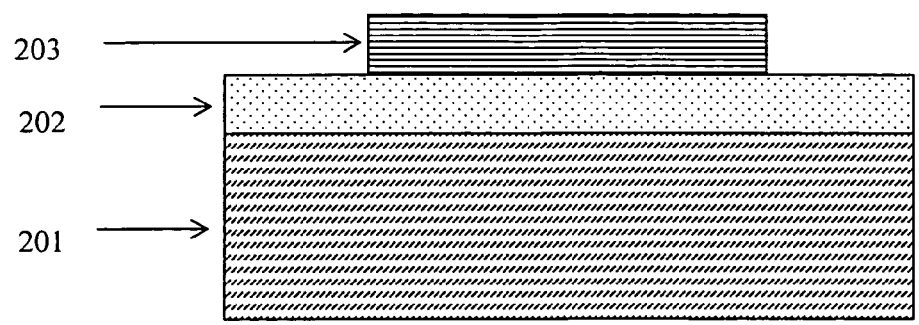

As seen in FIG. 2A, the TFT may be formed on a substrate 201. Examples of suitable substrates include polymer, glass, stainless steel, amorphous silicon, polycrystalline silicon, and single-crystalline silicon optionally containing per-fabricated conventional integrated circuits.

An insulating layer 202 may be formed on the substrate 201 (Step S20). Examples of suitable insulating layers include silicon oxide, silicon oxynitride, and silicon nitride.

A semiconductor island layer 203 may be formed on the insulating layer (Step S21). Examples of suitable semiconductor layers include silicon (Si), silicon-germanium alloy ($Si_xGe_{1-x}$), germanium (Ge) in the amorphous, polycrystalline, or single crystalline state, or combinations of Si $Si_xGe_{1-x}$ or Ge layers in the amorphous, polycrystalline or single crystalline states.

Figure 2B:
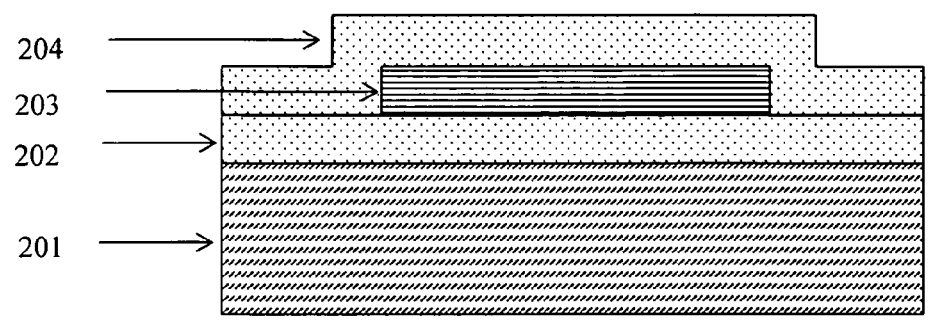

As seen in FIG. 2B, a gate dielectric layer 204 may be formed over the semiconductor island 203 and the insulating layer 202 (Step S22). Examples of a suitable gate dielectric 204 include silicon dioxide, silicon oxynitride, silicon nitride, and high dielectric constant (high-k) insulating materials.

Figure 2C:
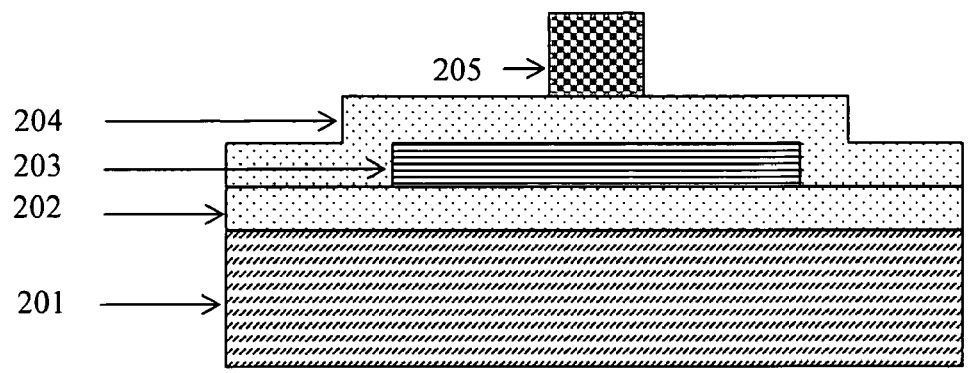

As seen in FIG. 2C, a gate electrode 205 may be formed over the gate dielectric layer 204 (Step S23). Examples of a suitable gate electrode 205 include metal, silicide, semiconductor or layer combinations thereof.

Figure 2D:
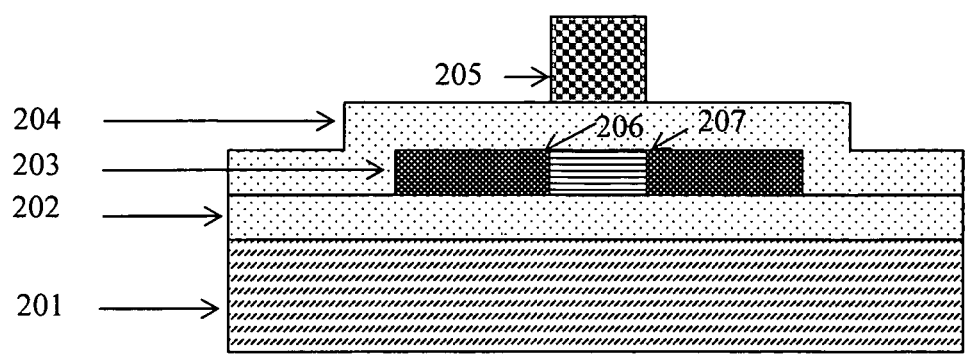

As seen in FIG. 2D, source 206 and drain 207 regions may be formed by self-aligned introduction, such as by ion implantation, of impurities into selected regions of the semiconductor layer 203 (Step S24).

Figure 2E:
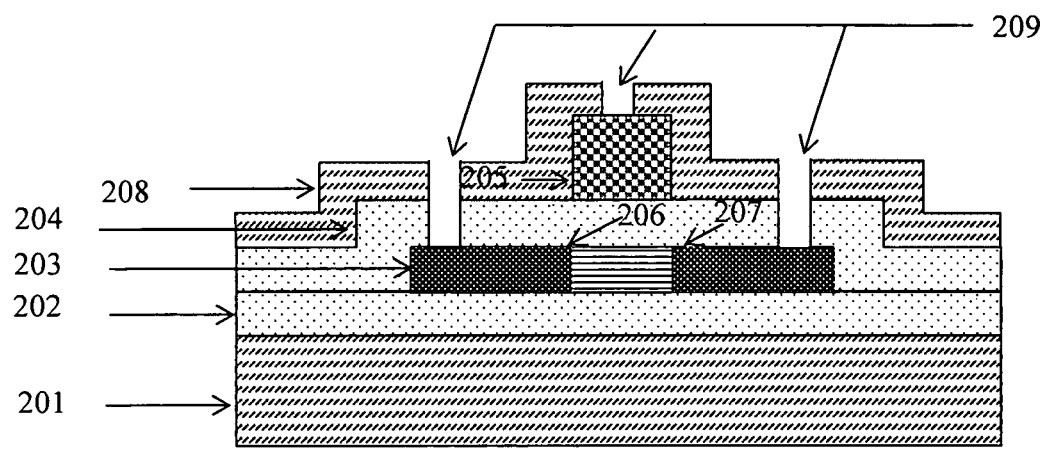

As seen in FIG. 2E, a second insulating layer 208 may be formed over the gate dielectric layer 204 and the gate electrode 205 (Step S25). Replacement windows 209 may then be opened through the second insulating layer 208 and the gate dielectric layer 204 to expose a portion of the gate electrode 205, source 206, and drain 207 (Step S26).

Figure 2F:
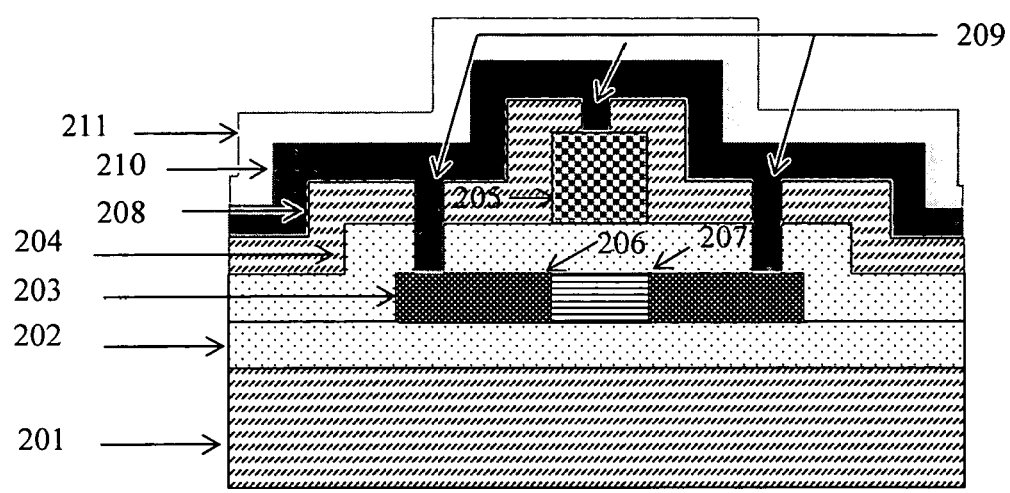

As seen in FIG. 2F, a bottom metal layer 210 may be formed over the second insulating layer 208 and through the replacement windows 209 (Step S27) such that the bottom metal layer 210 is in contact with the source 206, drain 207, and gate 205. A top metal layer 211 may be formed over the bottom metal layer 210 (Step S28). The bottom metal layer may be any suitable metal, for example, aluminum, silver, or gold.

Figure 2G:
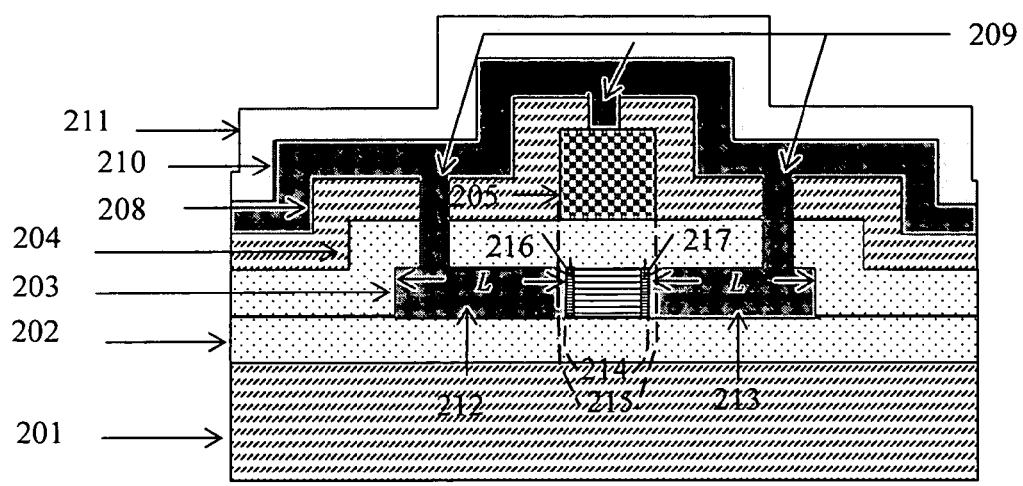

As seen in FIG. 2G, a low temperature (between 250-500° C.) heat-treatment process is performed wherein the semiconductor source 206 and drain 207 are replaced by the bottom metal 210 to form a metallic source 212 and metallic drain 213 (Step S29). The lateral extent (L) of the replacement is controlled by the heat-treatment time. The replacement fronts 214 should reach or slightly pass the edges of the gate projected downwards 215 (downward projection of edges of gate shown with broken lines). Small doped regions 216 and 217 are formed beyond the metal source 212 and metallic drain 213.

Figure 2H:
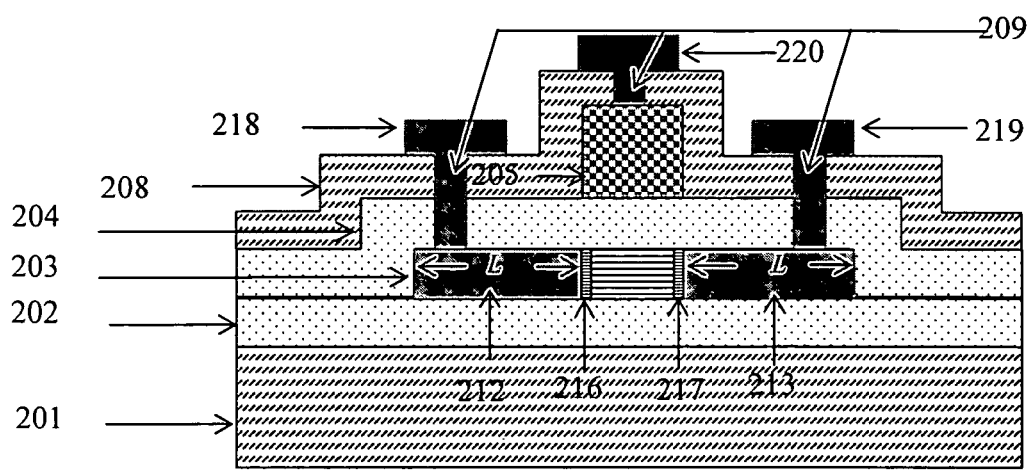

As seen in FIG. 2H, the top metal layer 211 may optionally be removed (Step S210). The remaining bottom metal layer 210 may be patterned into interconnects (Step S211) to provide an electrical access 218 to the metal source 212, an electrical access 219 to the metal drain 213, and an electrical access 220 to the gate 205.

FIGS. 3 and 3A-3G illustrate a method for fabricating a TFT with metallic source and drain according to another embodiment of the present invention.

Figure 3:
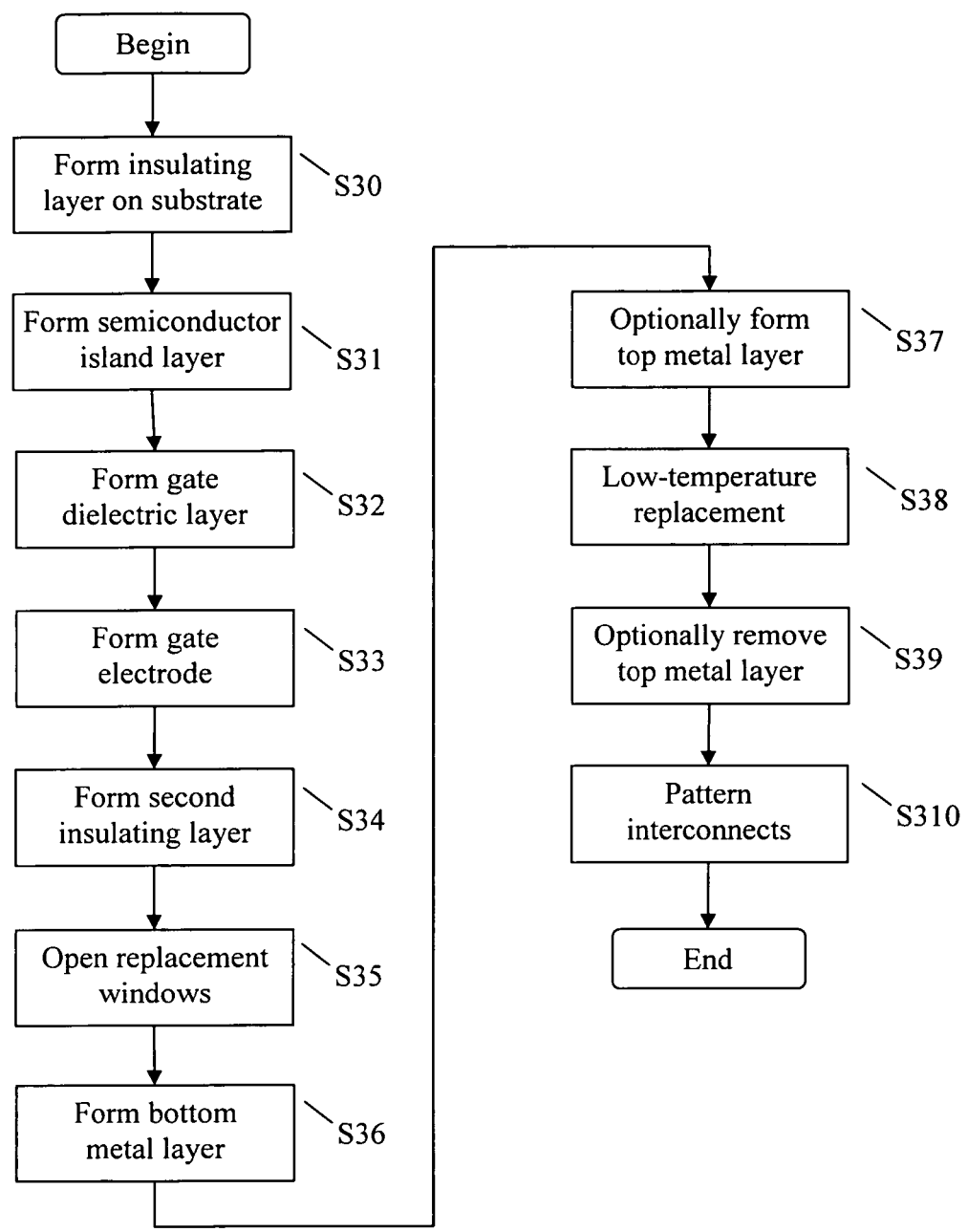
FIGS. 3 and 3A-3G are a flow chart and schematic cross section views illustrating a method for fabricating a TFT with metallic source and drain according to another embodiment of the present invention.
Figure 3A:
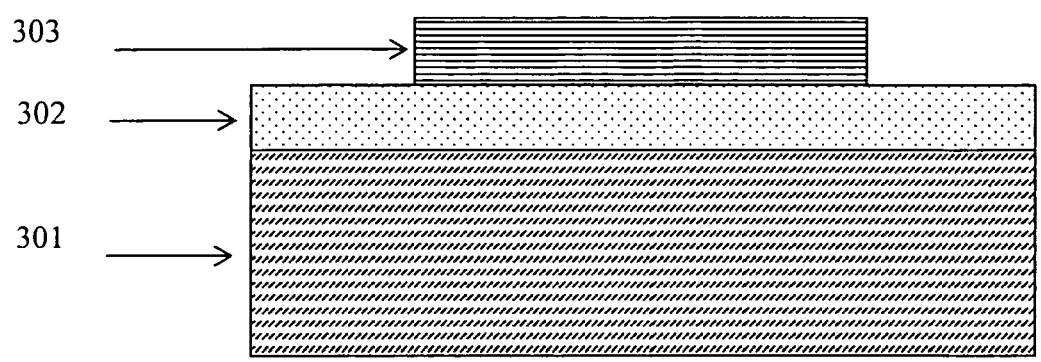

As seen in FIG. 3A, an insulating layer 302 may be formed on the substrate 301 (Step S30). A semiconductor island layer 303 may be formed on the insulating layer 302 (Step S31).

Figure 3B:
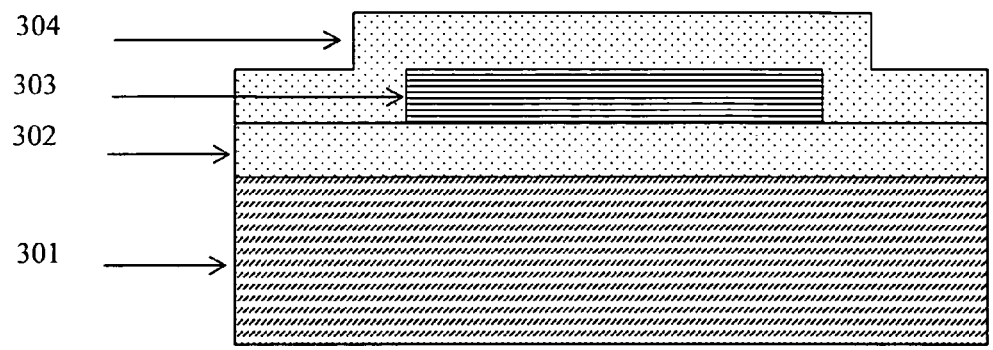

As seen in FIG. 3B, a gate dielectric layer 304 may be formed over the semiconductor island 303 and the insulating layer 302 (Step S32).

Figure 3C:
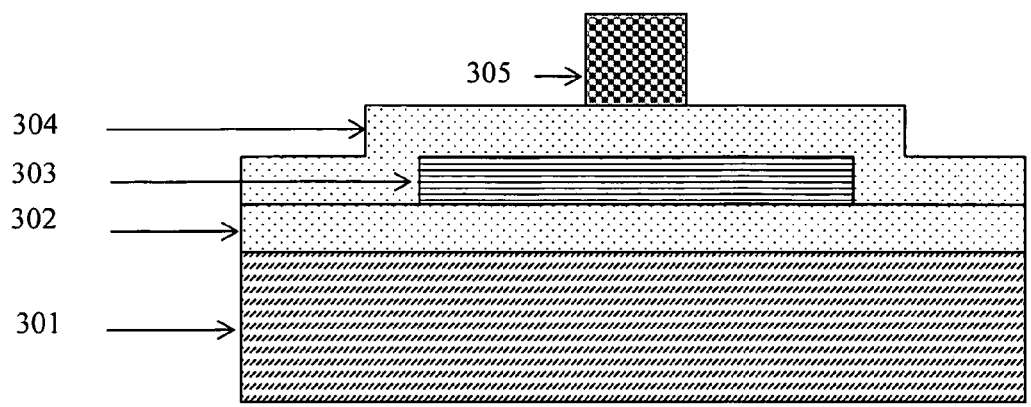

As seen in FIG. 3C, a gate electrode 305 may be formed over the gate dielectric layer 304 (Step S33).

Figure 3D:
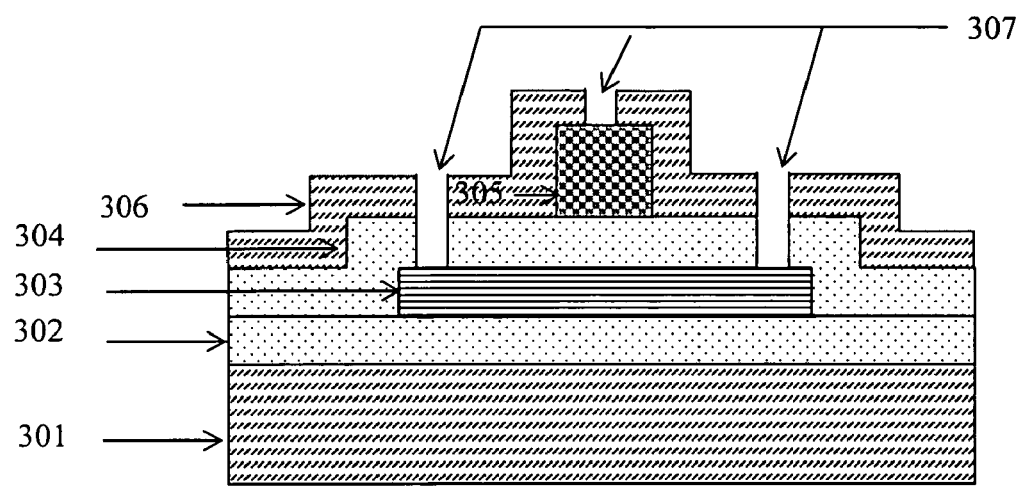

As can be seen in FIG. 3D, a second insulating layer 306 may be formed over the gate dielectric layer 304 and the gate electrode 305 (Step S34). Replacement windows 307 may then be opened through the second insulating layer 306 and the gate dielectric layer 304 to expose portions of the gate electrode 305 and semiconductor island 303 where source and drain are to be formed (see FIG. 3F 310 and 311) (Step S35).

Figure 3E:
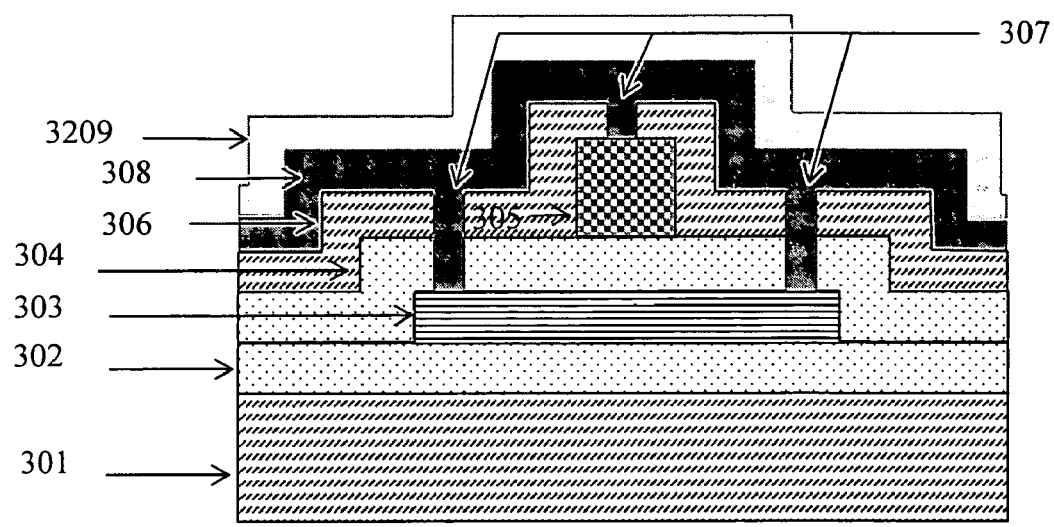
Figure 3F:
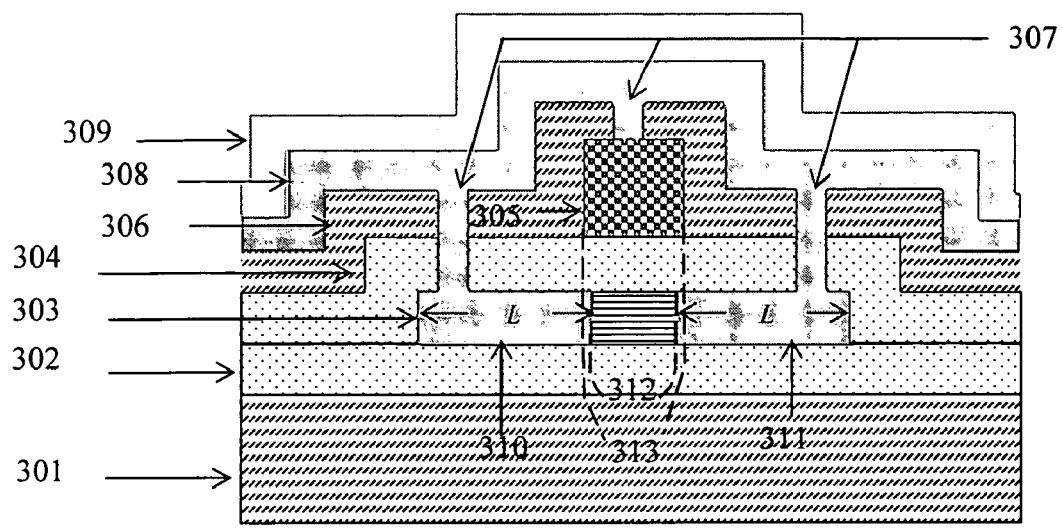

As seen in FIG. 3E, a bottom metal layer 308 may be formed over the second insulating layer 306 and through the replacement windows 307 (Step S36) such that the bottom metal layer 308 is in contact with the semiconductor island 303 where source and drain are to be formed (see FIG. 3F 310 and 311). A top metal layer 309 may be formed over the bottom metal layer 308 (Step S37).

As seen in FIG. 3F, a low temperature (between 250-500° C.) heat-treatment process is performed wherein source 310 and drain 311 regions of the semiconductor layer 303 are replaced by the bottom metal 308 (Step S38). The lateral extent (L) of the replacement is controlled by the heat-treatment time. The replacement fronts 312 should reach or slightly pass the edges of the gate projected downwards 313 (downward projection of edges of gate shown with broken lines).

Though the metal-replaced regions are not self-aligned to the edges of the channel regions of the proposed TFTs, the extent of any overlap between the source/drain and the gate can be minimized by lowering the process temperature—thus reducing the rate of metal replacement to a controllably low value. Furthermore, TFTs in most active-matrix display systems are not realized using self-aligned processes.

Figure 3G:
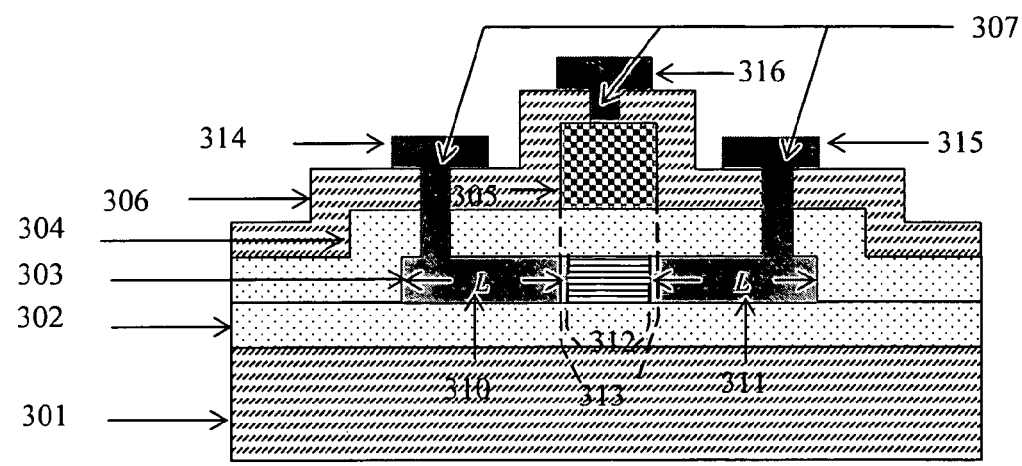

As seen in FIG. 3G, the top metal layer 309 may optionally be removed (Step S39). The remaining bottom metal layer 308 may be patterned into interconnects (Step S310) to provide an electrical access 314 to the metal source 310, an electrical access 315 to the metal drain 311, and an electrical access 316 to the gate 305.

FIGS. 4 and 4A-4I illustrate a method for fabricating a TFT with metallic source and drain according to another embodiment of the present invention.

Figure 4:
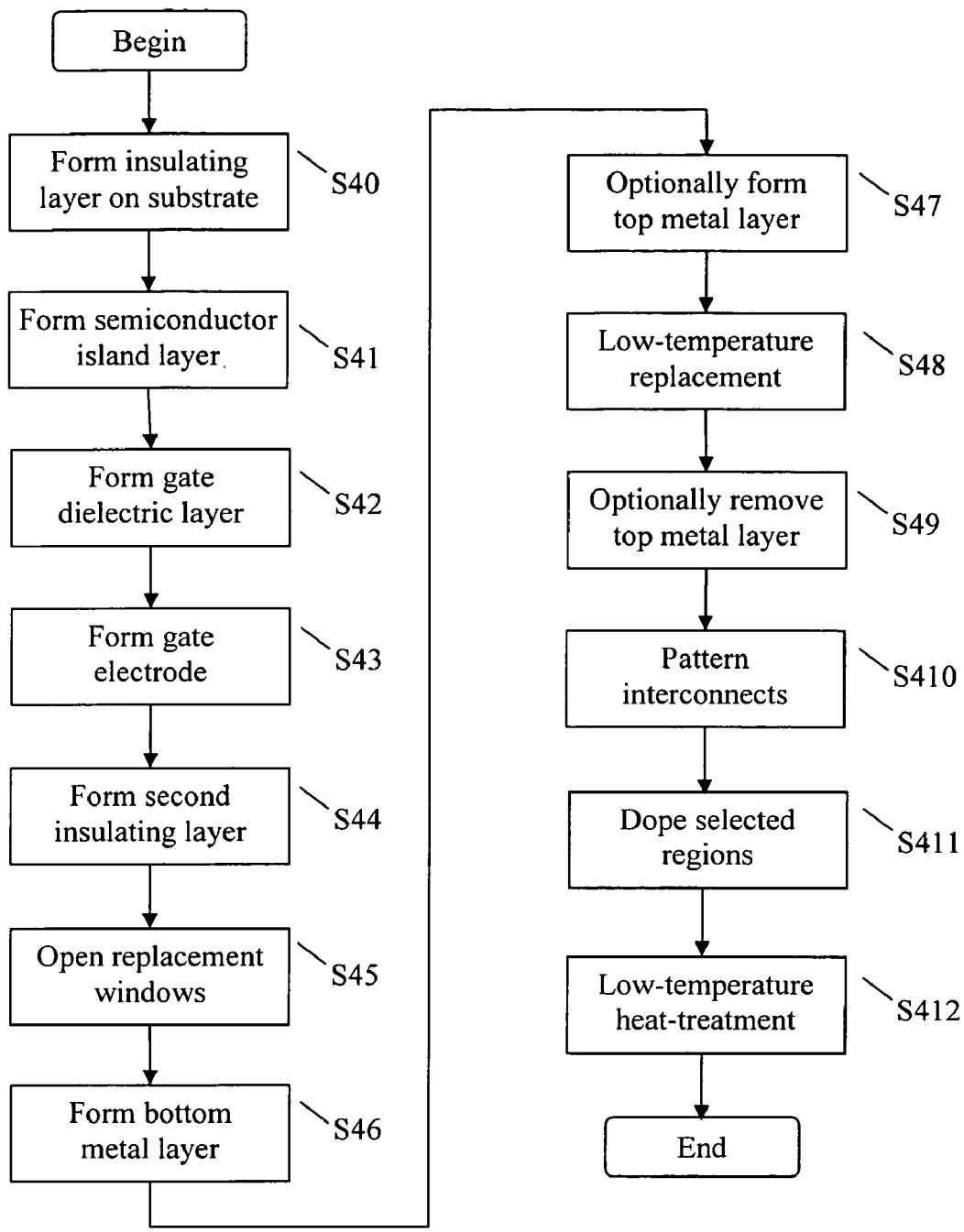
FIGS. 4 and 4A-4I are a flow chart and schematic cross section views illustrating a method for fabricating a TFT with metallic source and drain according to another embodiment of the present invention.
Figure 4A:
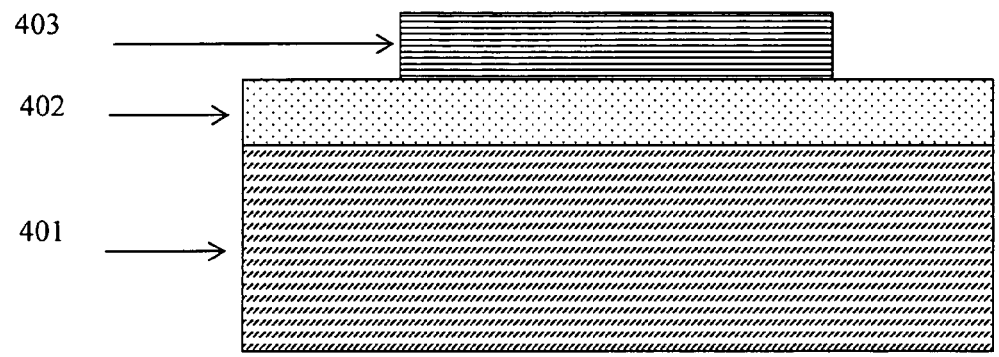

As seen in FIG. 4A, an insulating layer 402 may be formed on the substrate 401 (Step S40). A semiconductor island layer 403 may be formed on the insulating layer 402 (Step S41).

Figure 4B:
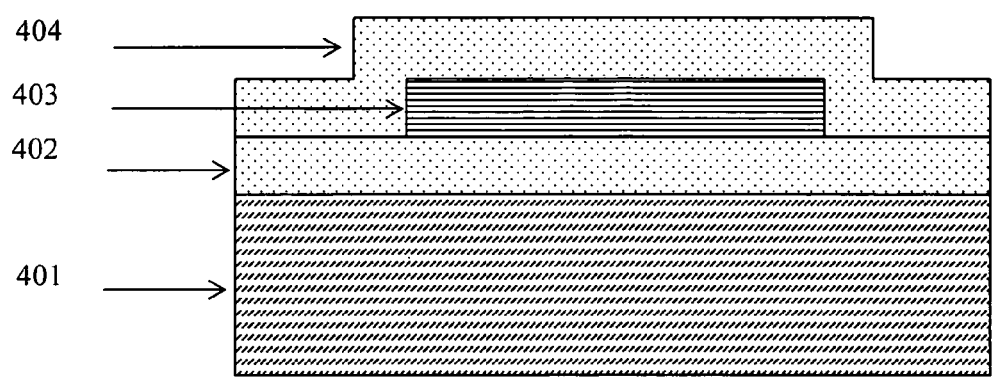

As seen in FIG. 4B, a gate dielectric layer 404 may be formed over the semiconductor island 403 and the insulating layer 402 (Step S42).

Figure 4C:
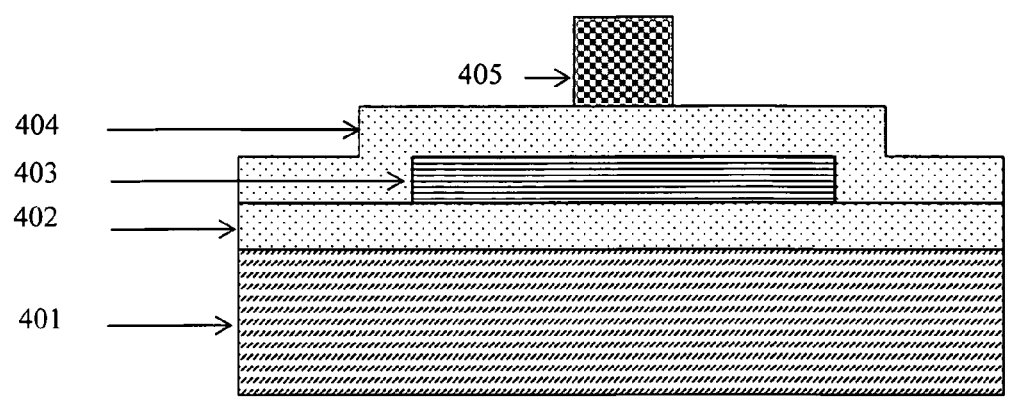

As seen in FIG. 4C, a gate electrode 405 may be formed over the gate dielectric layer 404 (Step S43).

Figure 4D:
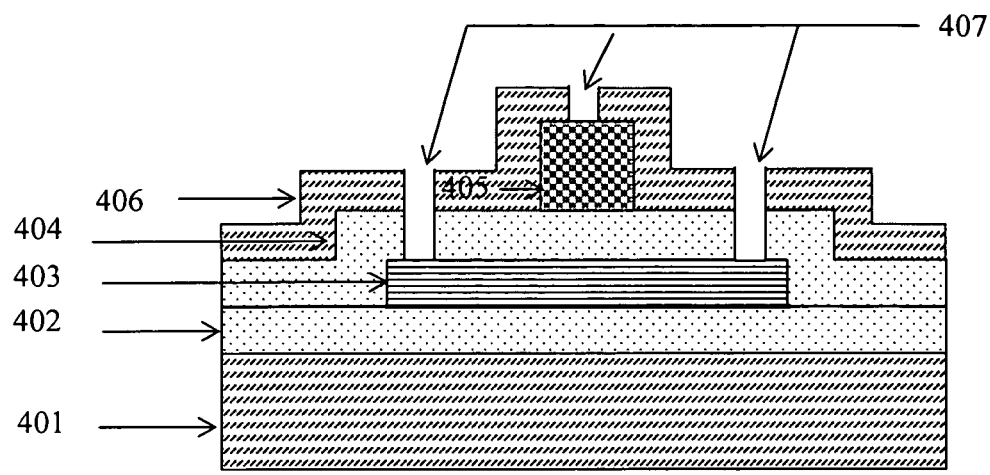

As can be seen in FIG. 4D, a second insulating layer 406 may be formed over the gate dielectric layer 404 and the gate electrode 405 (Step S44). Replacement windows 407 may then be opened through the second insulating layer 406 and the gate dielectric layer 404 to expose portions of the gate electrode 405 and semiconductor island 403 where source and drain are to be formed (see FIG. 4F 410 and 411) (Step S45).

Figure 4E:
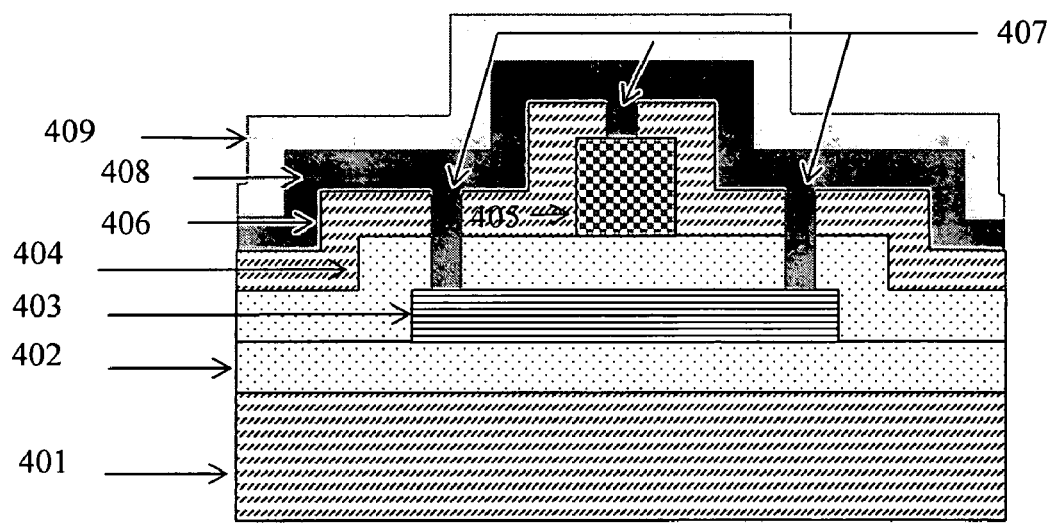
Figure 4F:
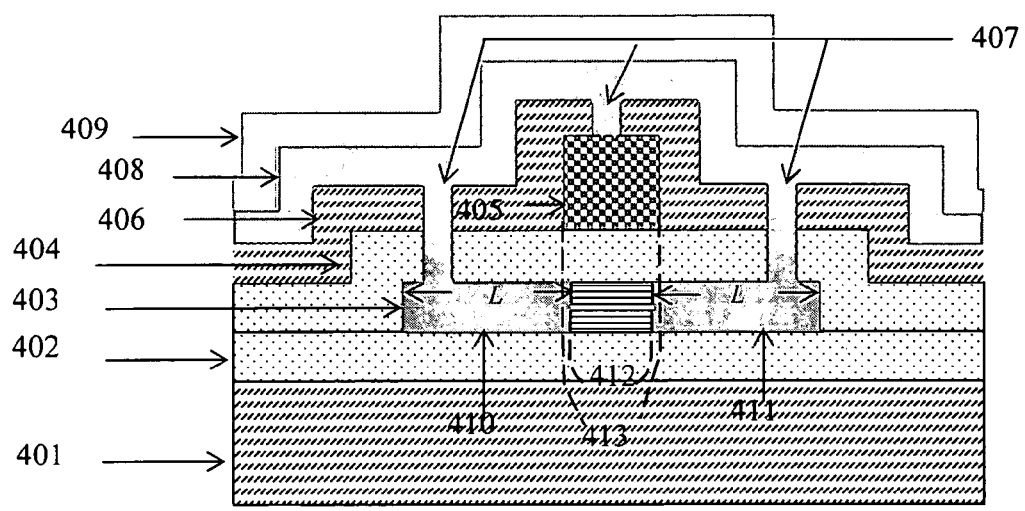

As seen in FIG. 4E, a bottom metal layer 408 may be formed over the second insulating layer 406 and through the replacement windows 407 (Step S46) such that the bottom metal layer 408 is in contact with the semiconductor island 403 where source and drain are to be formed (see FIG. 4F 410 and 411). A top metal layer 409 may be formed over the bottom metal layer 408 (Step S47).

As seen in FIG. 4F, a low temperature (between 250-500° C.) heat-treatment process is performed wherein source 410 and drain 411 regions of the semiconductor layer 403 are replaced by the bottom metal 408 (Step S48). The lateral extent (L) of the replacement is controlled by the heat-treatment time. The replacement fronts 412 should reach or slightly pass the edges of the gate projected downwards 413 (downward projection of edges of gate shown with broken lines).

Though the metal-replaced regions are not self-aligned to the edges of the channel regions of the proposed TFTs, the extent of any overlap between the source/drain and the gate can be minimized by lowering the process temperature—thus reducing the rate of metal replacement to a controllably low value. Furthermore, TFTs in most active-matrix display systems are not realized using self-aligned processes.

Figure 4G:
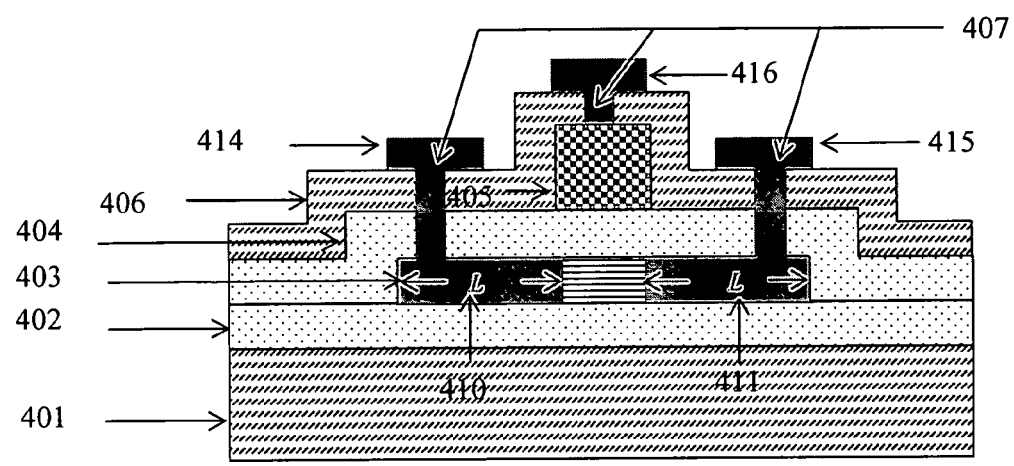

As seen in FIG. 4G, the top metal layer 409 may optionally be removed (Step S49). The remaining bottom metal layer 408 may be patterned into interconnects (Step S40) to provide an electrical access 414 to the metal source 410, an electrical access 415 to the metal drain 411, and an electrical access 416 to the gate 405.

Figure 4H:
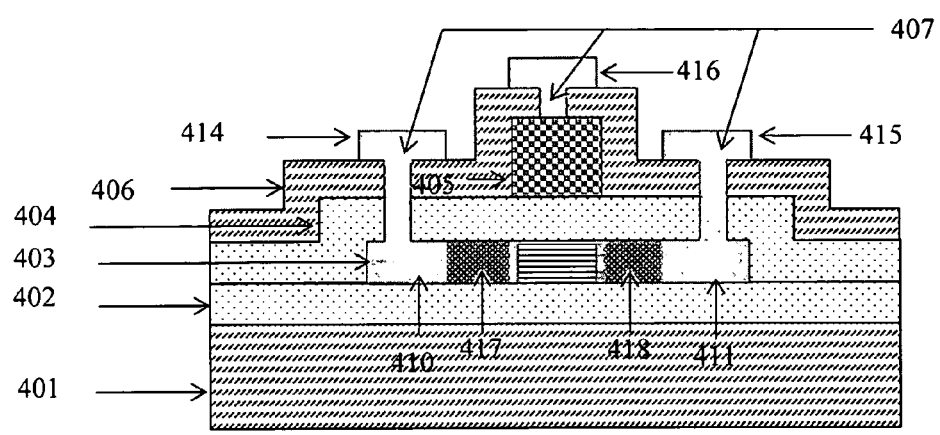

As seen in FIG. 4H, regions 417 and 418 may be formed by self-aligned introduction, such as by ion implantation, of impurities into selected regions of the semiconductor layer 403 (Step S411).

Figure 4I:
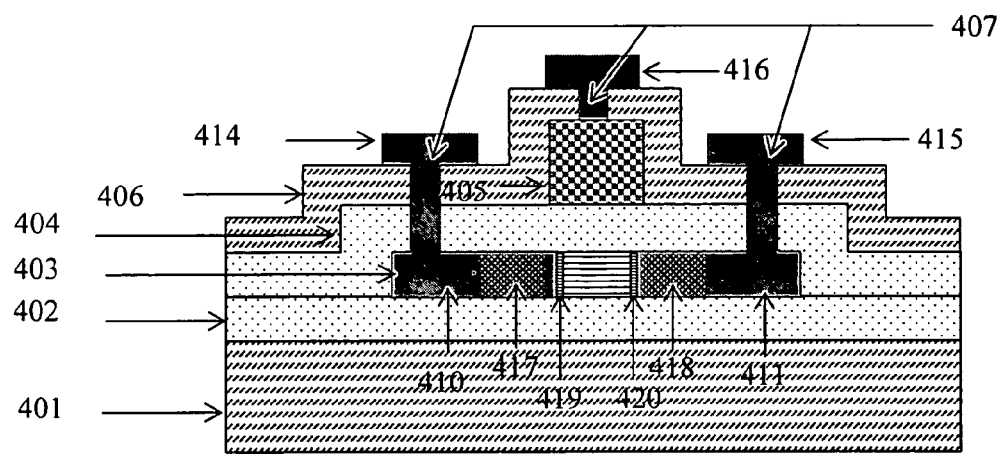

As can be seen in FIG. 4I, a low temperature (between 250-500° C.) heat-treatment process is performed (Step S412) wherein small doped regions 419 and 420 are formed beyond the metal source and drain.

FIGS. 5 and 5A-5F illustrate a method for fabricating a TFT with metallic gate, source and drain according to another embodiment of the present invention.

Figure 5:
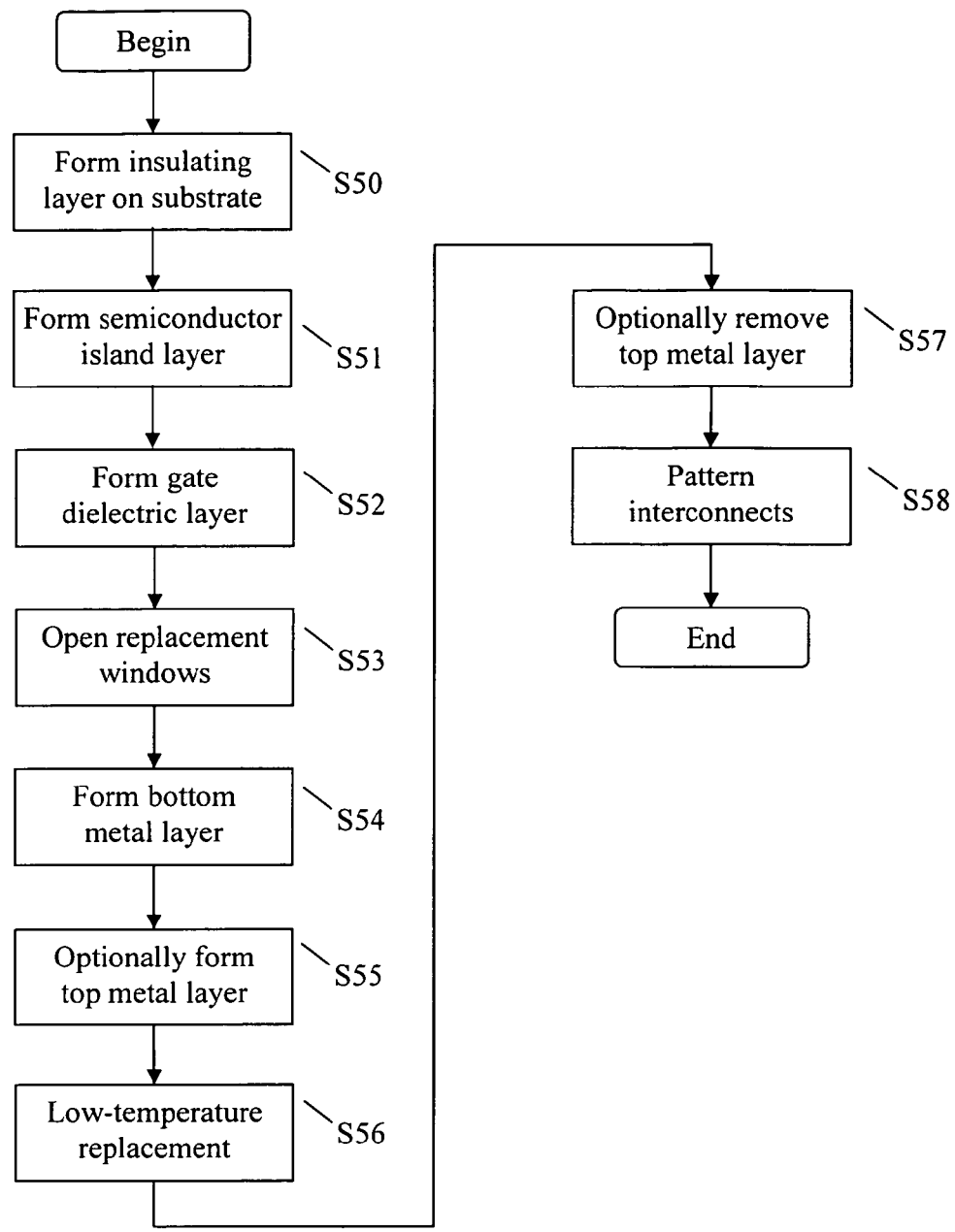
FIGS. 5 and 5A-5F are a flow chart and schematic cross section views illustrating a method for fabricating a TFT with metallic gate, source and drain according to another embodiment of the present invention.
Figure 5A:
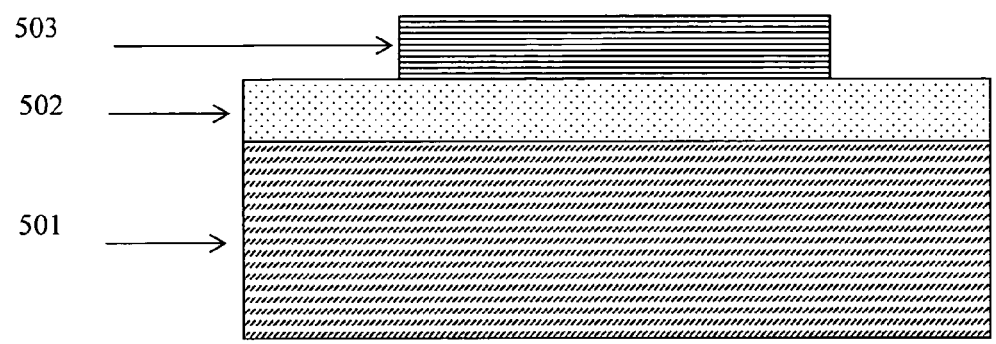

As seen in FIG. 5A, an insulating layer 502 may be formed on the substrate 501 (Step S50). A semiconductor island layer 503 may be formed on the insulating layer 502 (Step S51).

Figure 5B:
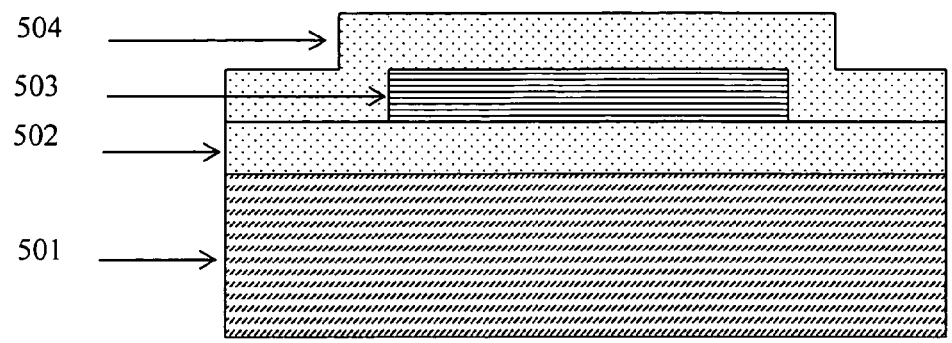

As seen in FIG. 5B, a gate dielectric layer 504 may be formed over the semiconductor island 503 and the insulating layer 502 (Step S52).

Figure 5C:
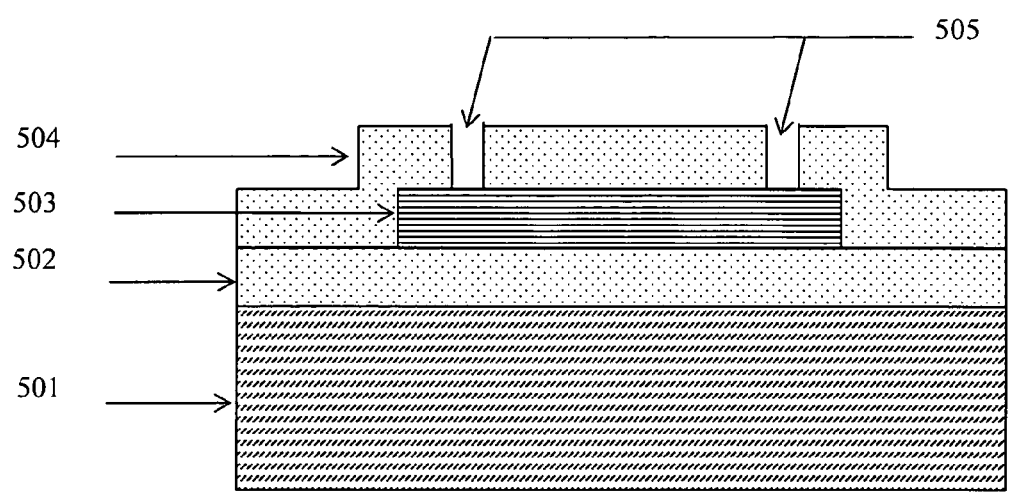

As seen in FIG. 5C, replacement windows 505 may then be opened through the gate dielectric layer 504 to expose portions of the semiconductor island 503 where source and drain are to be formed (see FIG. 5E 508 and 509) (Step S53).

Figure 5D:
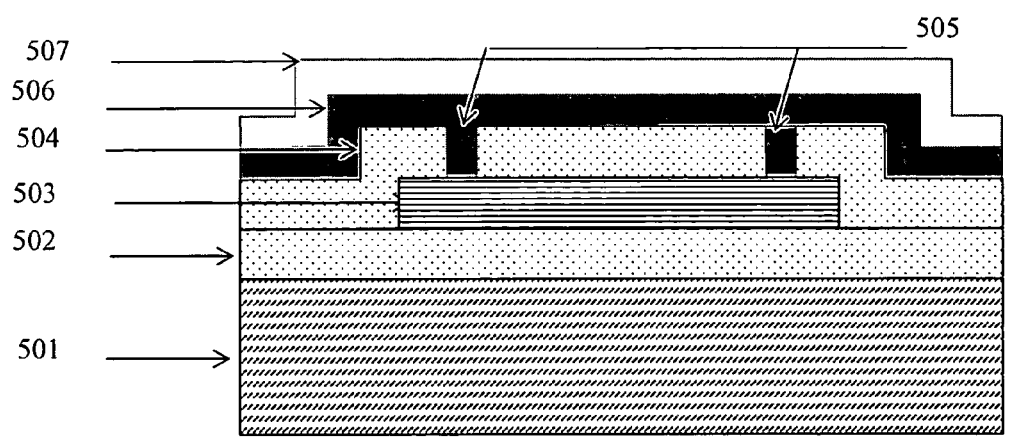
Figure 5E:
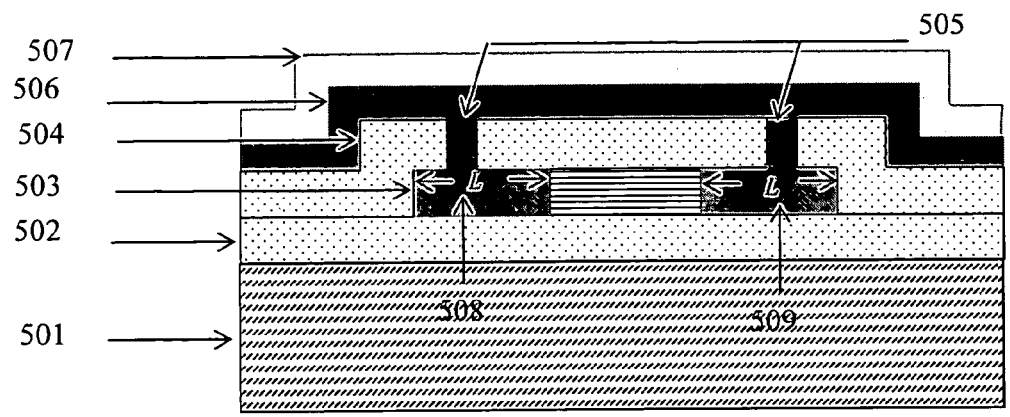

As seen in FIG. 5D, a bottom metal layer 506 may be formed over the gate dielectric layer 504 and through the replacement windows 505 (Step S54) such that the bottom metal layer 506 is in contact with the semiconductor island 503 where source and drain are to be formed (see FIG. 5E 508 and 509). A top metal layer 507 may be formed over the bottom metal layer 506 (Step S55).

As seen in FIG. 5E, a low-temperature (between 250-500° C.) heat-treatment process is performed wherein source 508 and drain 509 regions of the semiconductor layer 503 are replaced by the bottom metal 506 (Step S56). The lateral extent (L) of the replacement is controlled by the heat-treatment time.

Figure 5F:
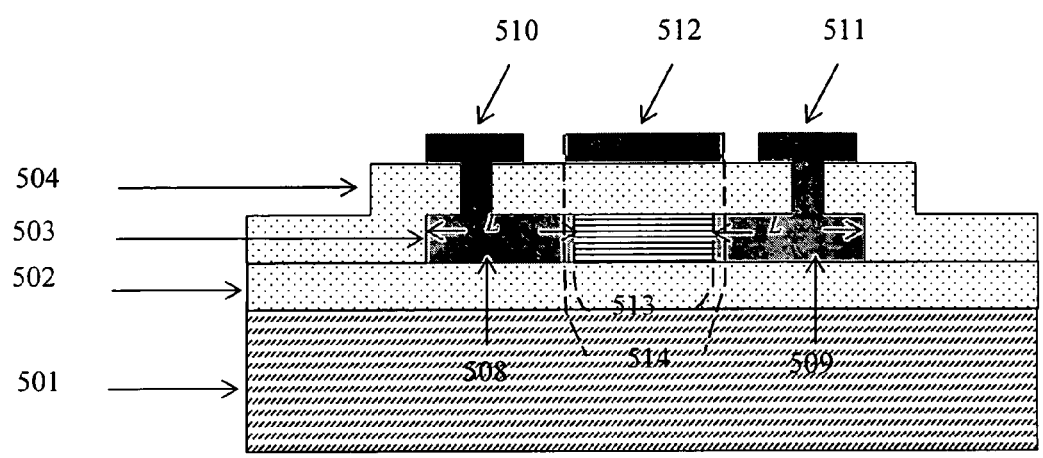

As seen in FIG. 5F, the top metal layer 507 may optionally be removed (Step S57). The remaining bottom metal layer 506 may be patterned into interconnects (Step S58) to provide an electrical access 510 to the metal source 508, an electrical access 511 to the metal drain 509, and an electrical access/gate electrode 512.

The replacement fronts 513 should reach or slightly pass the edges of the electrical access/gate electrode 512 projected downwards 514 (downward projection of edges of gate shown with broken lines).

FIGS. 6 and 6A-6G illustrate a method for fabricating a TFT with metallic gate, source and drain according to another embodiment of the present invention.

Figure 6:
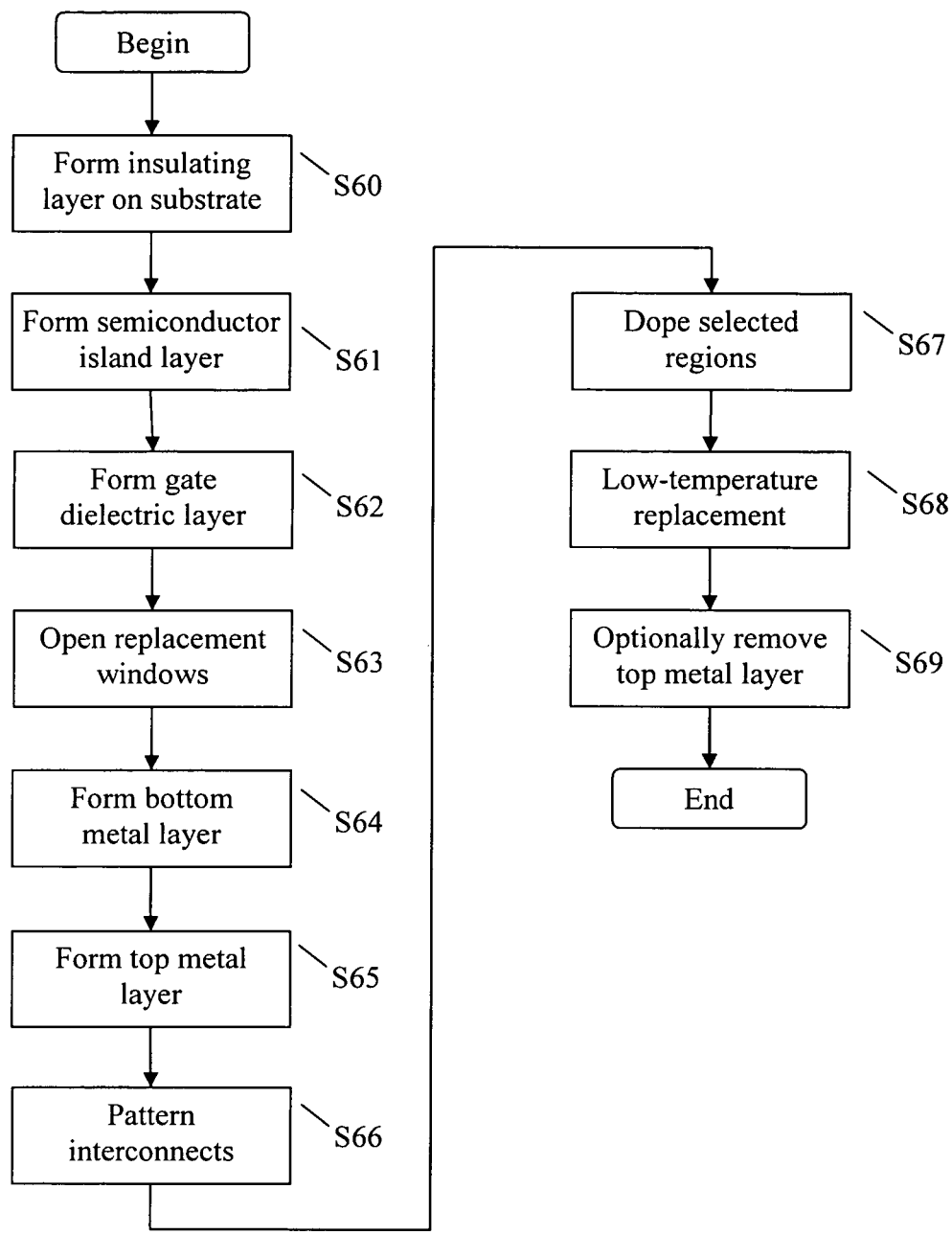
FIGS. 6 and 6A-6G are a flow chart and schematic cross section views illustrating a method for fabricating a TFT with metallic gate, source and drain according to another embodiment of the present invention.
Figure 6A:
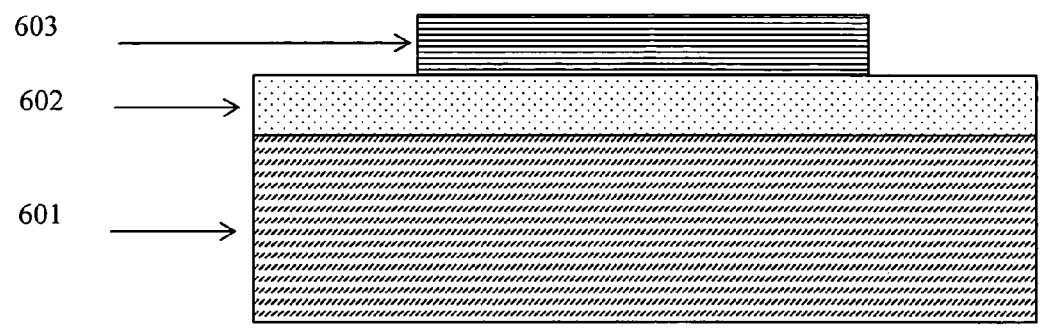

As seen in FIG. 6A, an insulating layer 602 may be formed on the substrate 601 (Step S60). A semiconductor island layer 603 may be formed on the insulating layer 602 (Step S61).

Figure 6B:
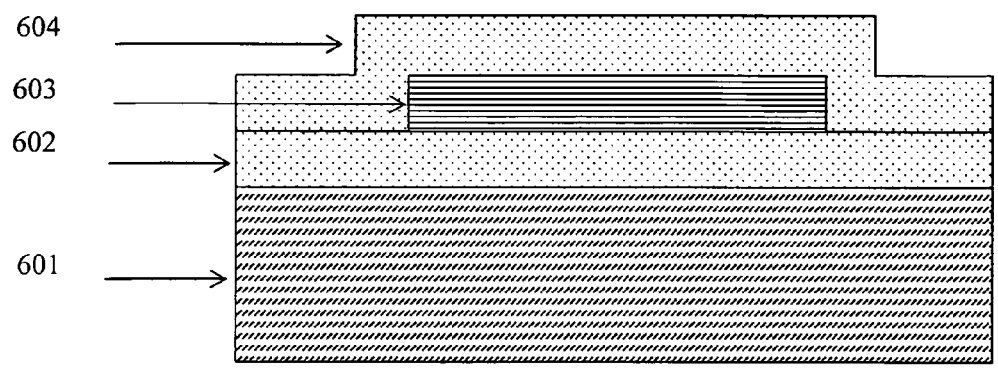

As seen in FIG. 6B, a gate dielectric layer 604 may be formed over the semiconductor island 603 and the insulating layer 602 (Step S62).

Figure 6C:
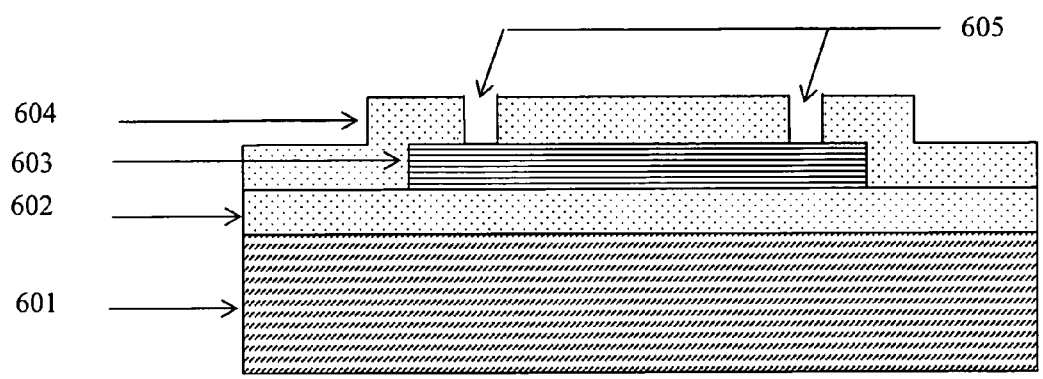

As seen in FIG. 6C, replacement windows 605 may then be opened through the gate dielectric layer 604 to expose portions of the semiconductor island 603 where source and drain are to be formed (see FIG. 6G 613 and 614) (Step S63).

Figure 6D:
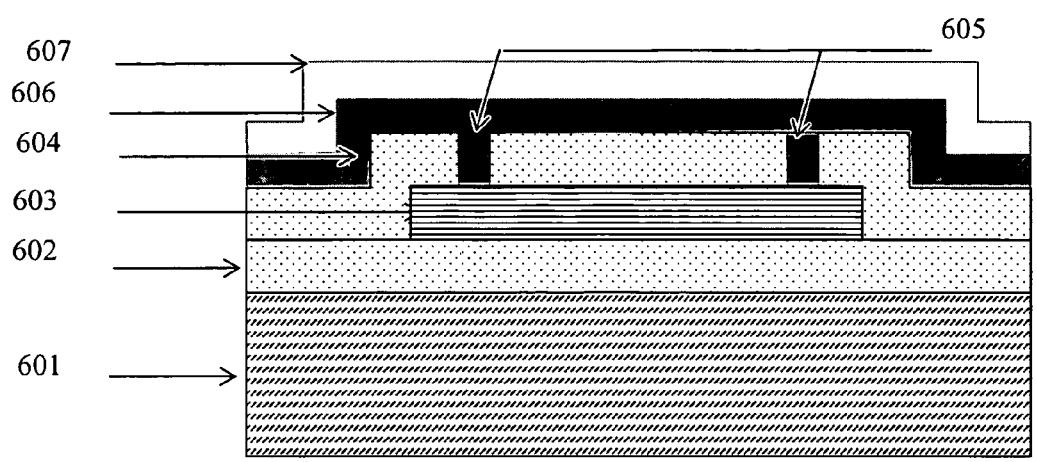
Figure 6E:
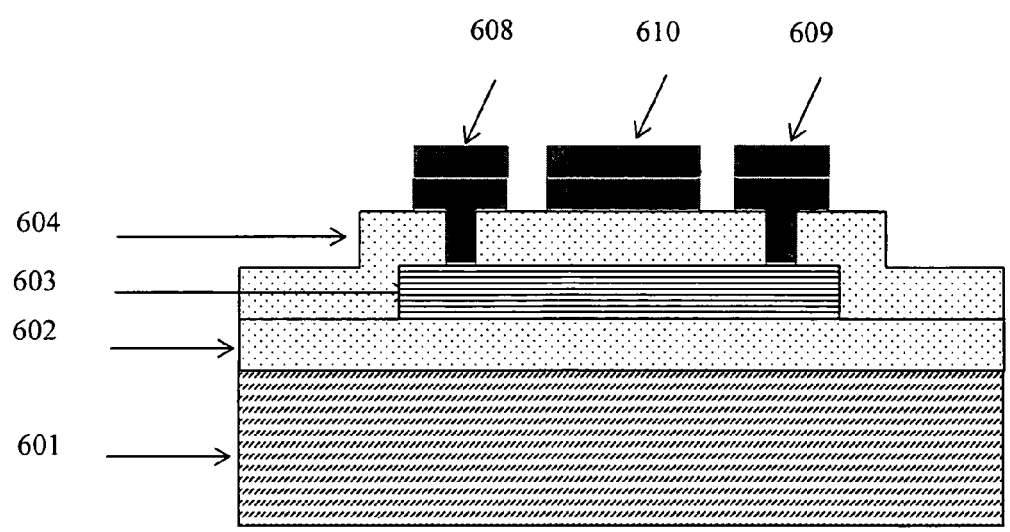
Figure 6F:
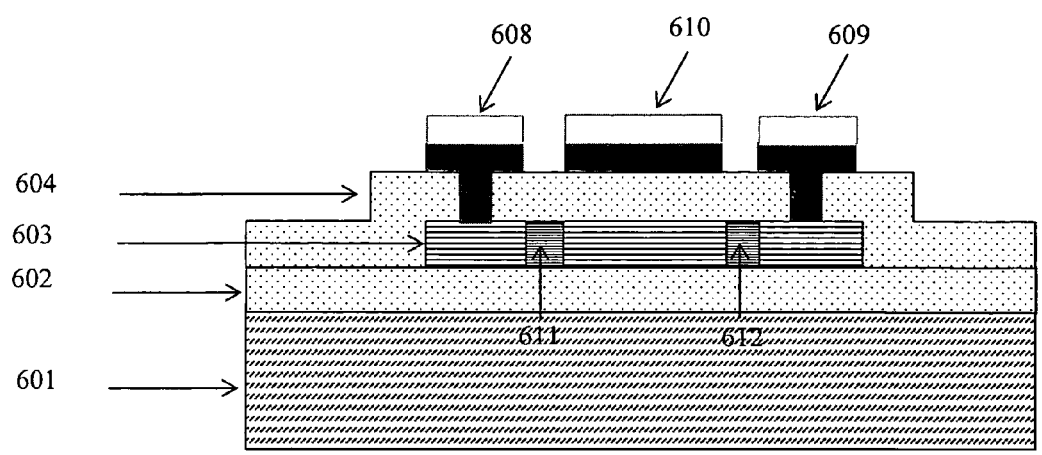
Figure 6G:
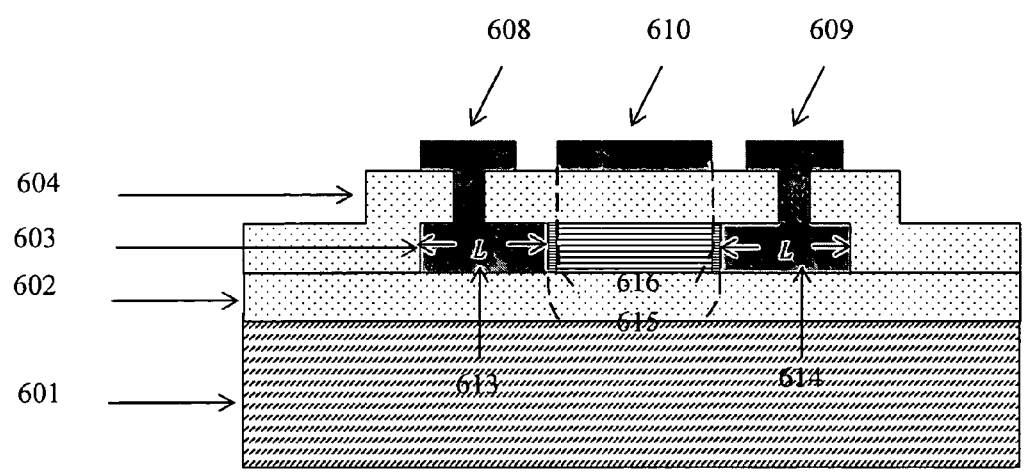

As seen in FIG. 6D, a bottom metal layer 606 may be formed over the gate dielectric layer 604 and through the replacement windows 605 (Step 64) such that the bottom metal layer 606 is in contact with the semiconductor island 603 where source and drain are to be formed (see FIG. 6G 613 and 614). A top metal layer 607 may be formed over the bottom metal layer 606 (Step S65).

As seen in FIG. 6E, the top metal layer 607 and the bottom metal layer 606 are each patterned into interconnects (Step S66) to provide electrical accesses 608 and 609 to the semiconductor island 603 where source and drain are to be formed (see FIG. 6G 613 and 614) and an electrical access/gate electrode 610.

As seen in FIG. 6F, regions may be formed by self-aligned introduction, such as by ion implantation, of impurities into selected regions 611 and 612 of the semiconductor layer 603 (Step S67).

As can be seen in FIG. 6G, a low-temperature (between 250-500° C.) heat-treatment process is performed wherein source 613 and drain 614 regions of the semiconductor layer 603 are replaced by the bottom metal 606 (Step S68). The lateral extent (L) of the replacement is controlled by the heat-treatment time. The replacement fronts 615 should not reach the edges of the electrical access/gate electrode 610 projected downwards 616 (downward projection of edges of gate shown with broken lines). The top metal layer 607 is optionally removed (Step S69).

FIGS. 7 and 7A-7G illustrate a method for fabricating a TFT with metallic gate, source and drain according to another embodiment of the present invention.

Figure 7:
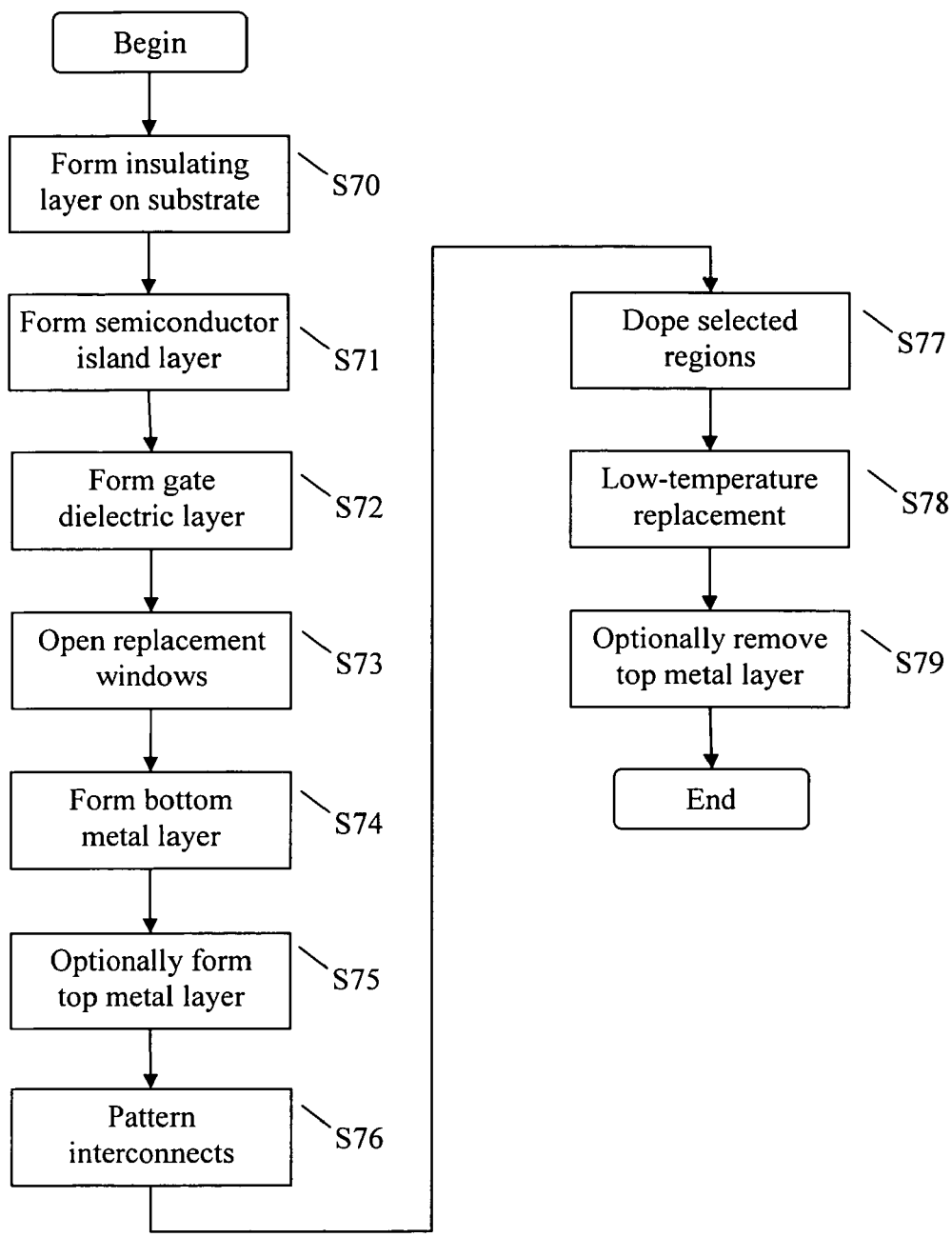
FIGS. 7 and 7A-7G are a flow chart and schematic cross section views illustrating a method for fabricating a TFT with metallic gate, source and drain according to another embodiment of the present invention.
Figure 7A:
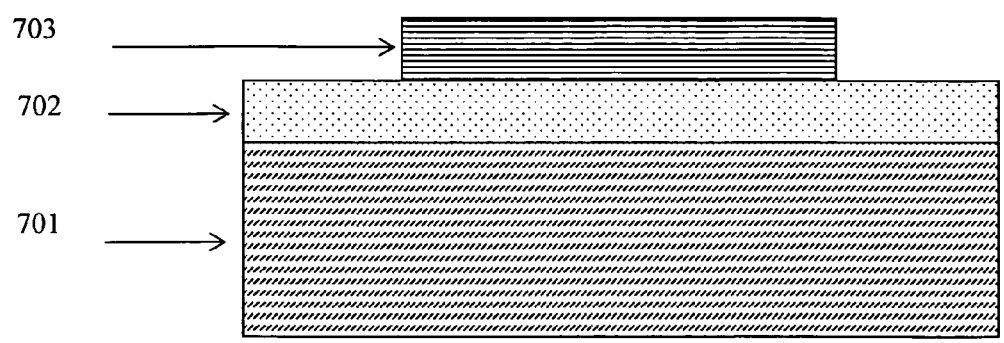

As seen in FIG. 7A, an insulating layer 702 may be formed on the substrate 701 (Step S70). A semiconductor island layer 703 may be formed on the insulating layer 702 (Step S71).

Figure 7B:
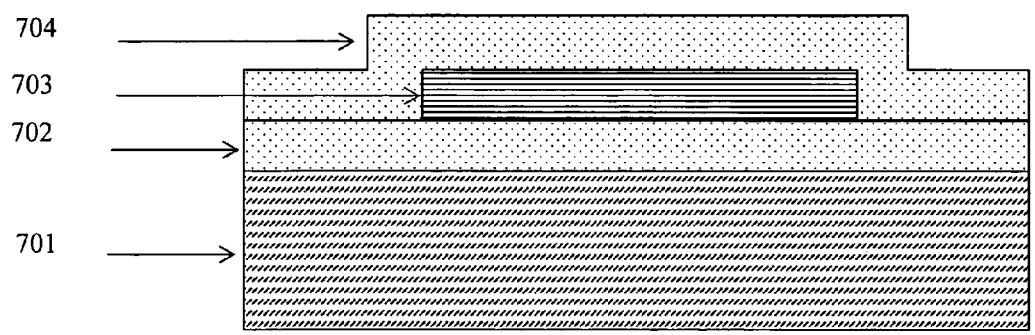

As seen in FIG. 7B, a gate dielectric layer 704 may be formed over the semiconductor island 703 and the insulating layer 702 (Step S72).

Figure 7C:
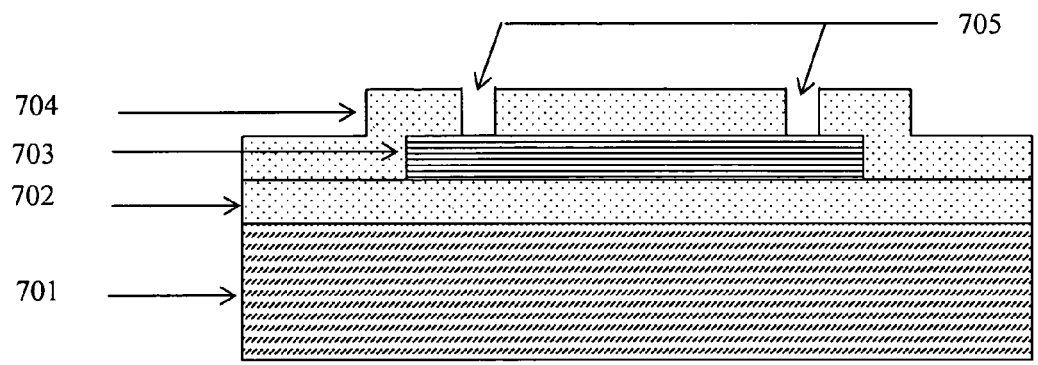

As seen in FIG. 7C, replacement windows 705 may then be opened through the gate dielectric layer 704 to expose portions of the semiconductor island 703 where source and drain are to be formed (see FIG. 7G 713 and 714) (Step S73).

Figure 7D:
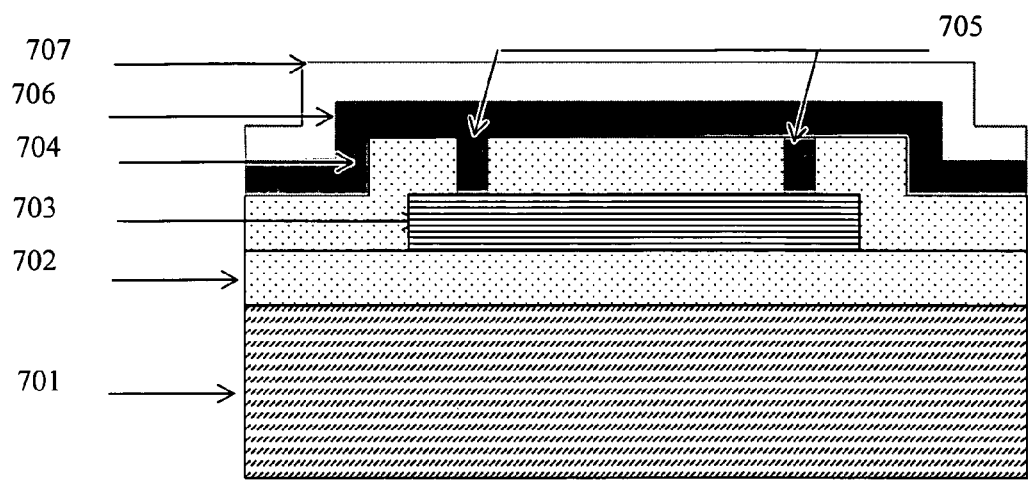
Figure 7E:
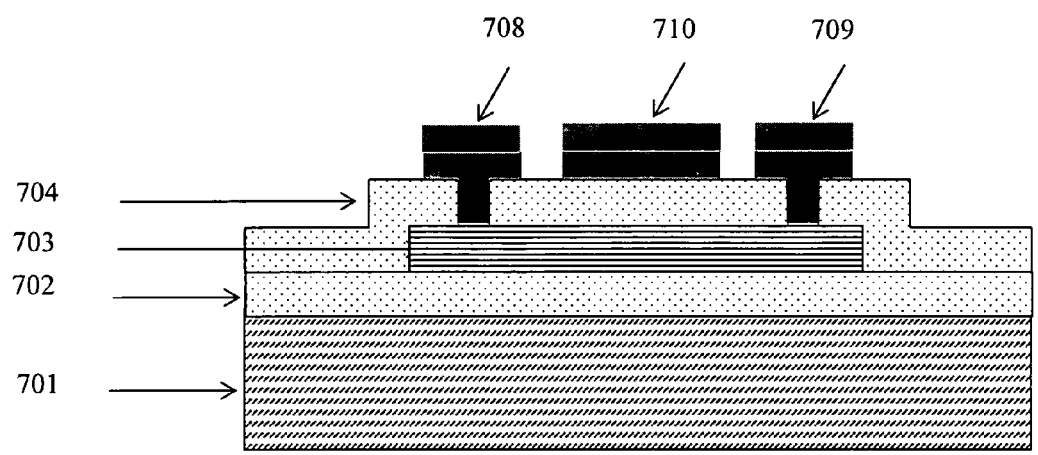
Figure 7F:
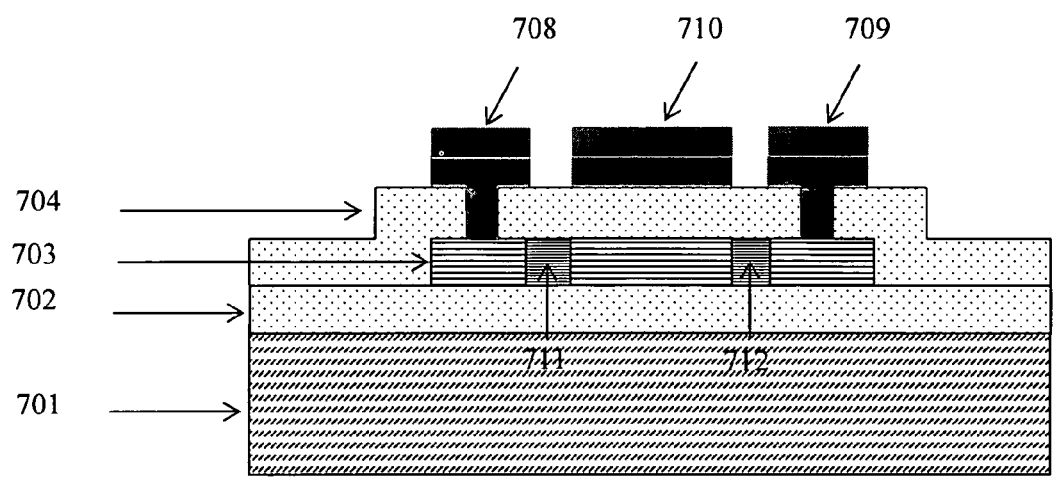
Figure 7G:
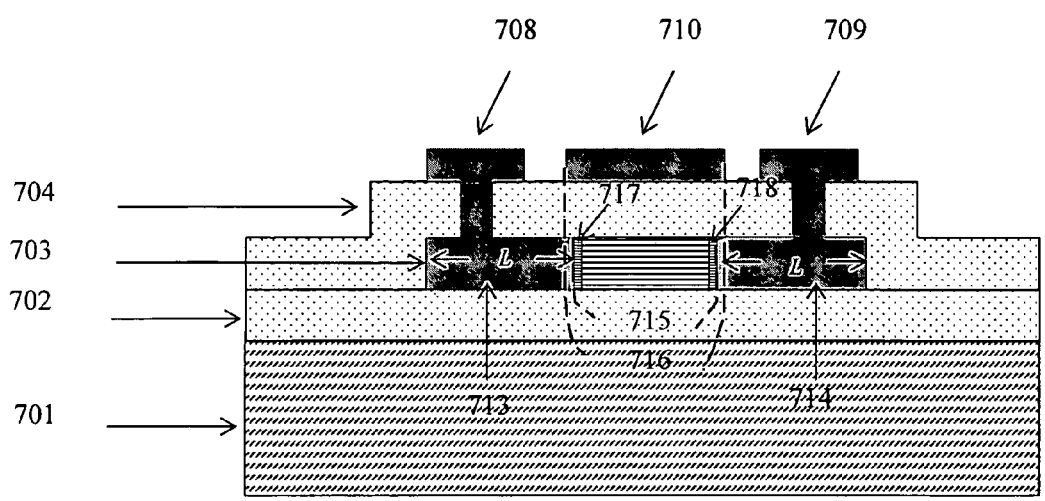

As seen in FIG. 7D, a bottom metal layer 706 may be formed over the gate dielectric layer 704 and through the replacement windows 705 (Step 74) such that the bottom metal layer 706 is in contact with the semiconductor island 703 where source and drain are to be formed (see FIG. 7G 713 and 714). A top metal layer 707 may be formed over the bottom metal layer 706 (Step S75).

As seen in FIG. 7E, the top metal layer 707 and the bottom metal layer 706 are each patterned into interconnects (Step S76) to provide electrical accesses 708 and 709 to the semiconductor island 703 where source and drain are to be formed (see FIG. 7G 713 and 714) and an electrical access/gate electrode 710.

As seen in FIG. 7F, regions may be formed by self-aligned introduction, such as by ion implantation, of impurities into selected regions 711 and 712 of the semiconductor layer 703 (Step S77).

As can be seen in FIG. 7G, a low-temperature (between 250-500° C.) heat-treatment process is performed wherein source 713 and drain 714 regions of the semiconductor layer 703 are replaced by the bottom metal 706 (Step S78). The lateral extent (L) of the replacement is controlled by the heat-treatment time. The replacement fronts 715 should reach or pass beyond the edges of the electrical access/gate electrode 710 projected downwards 716 (downward projection of edges of gate shown with broken lines). Small doped regions 717 and 718 are formed beyond to the metal junctions 713 and 714. The top metal layer 707 is optionally removed (Step S79).

FIGS. 8 and 8A-8H illustrate a method for fabricating a TFT with metallic gate, source and drain according to another embodiment of the present invention.

Figure 8:
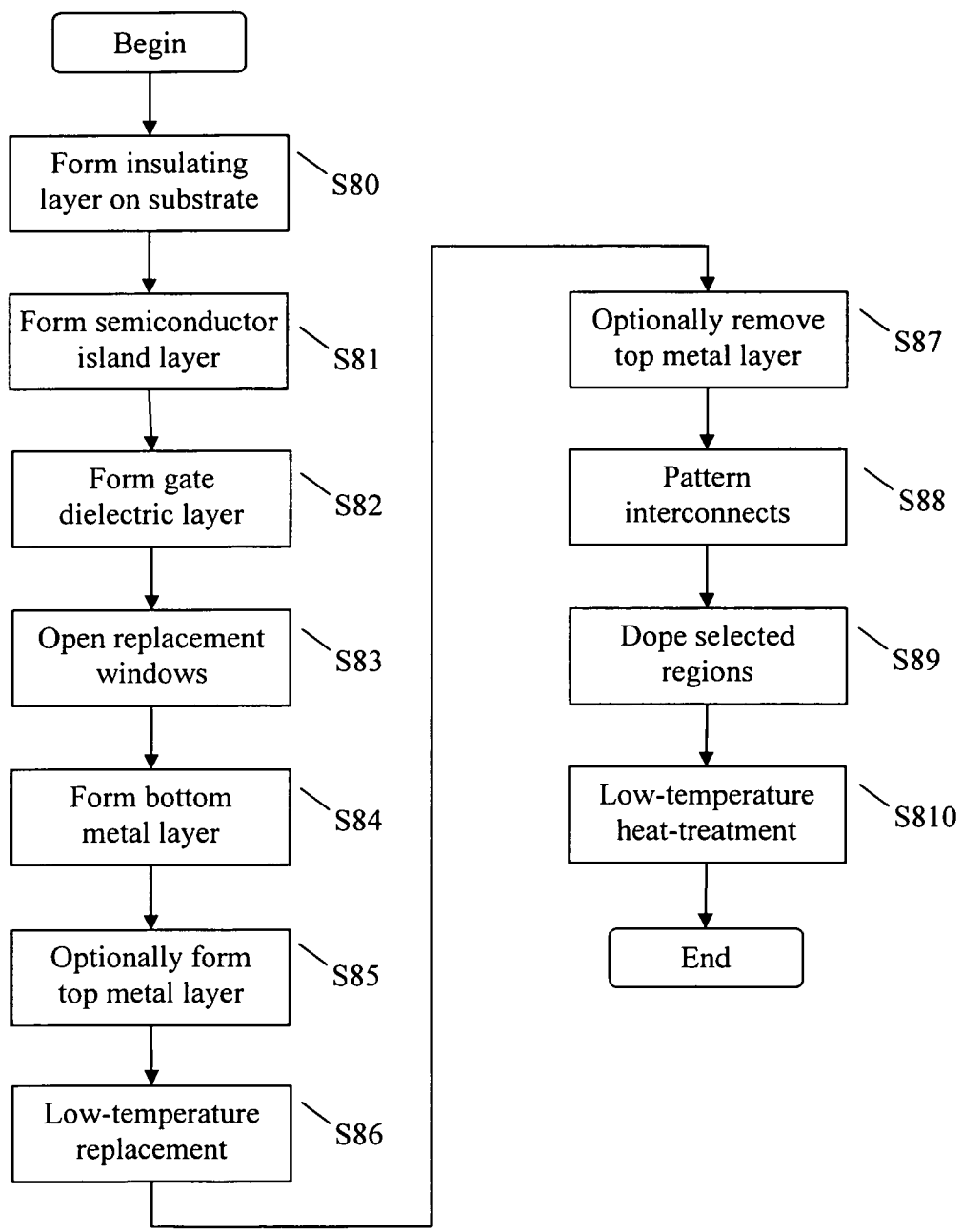
FIGS. 8 and 8A-8H are a flow chart and schematic cross section views illustrating a method for fabricating a TFT with metallic gate, source and drain according to another embodiment of the present invention.
Figure 8A:
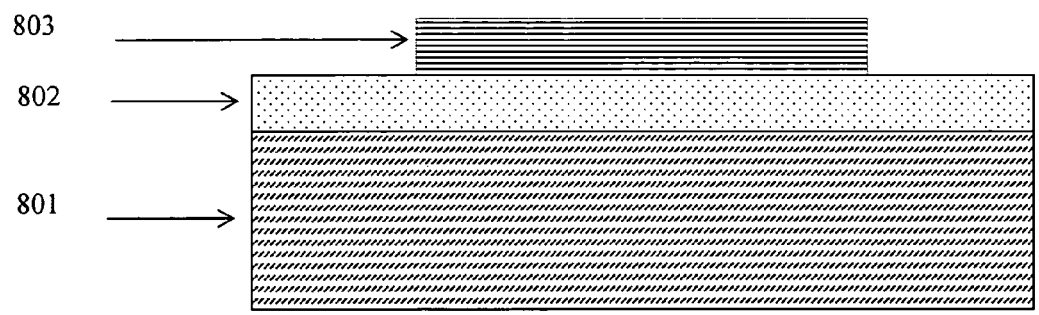

As seen in FIG. 8A, an insulating layer 802 may be formed on the substrate 801 (Step S80). A semiconductor island layer 803 may be formed on the insulating layer 802 (Step S81).

Figure 8B:
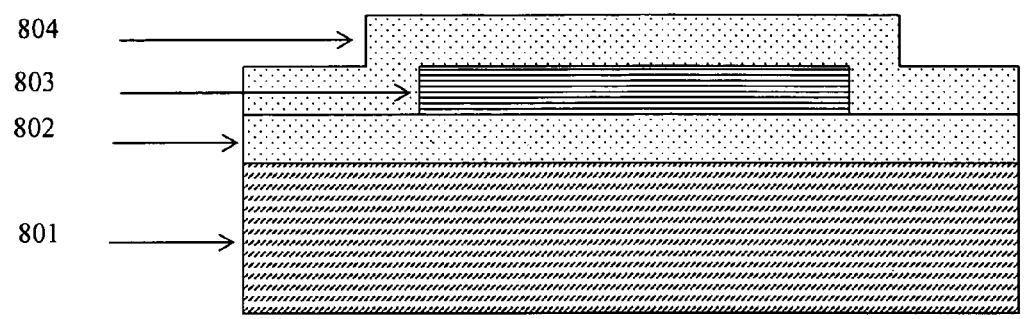

As seen in FIG. 8B, a gate dielectric layer 804 may be formed over the semiconductor island 803 and the insulating layer 802 (Step S82).

Figure 8C:
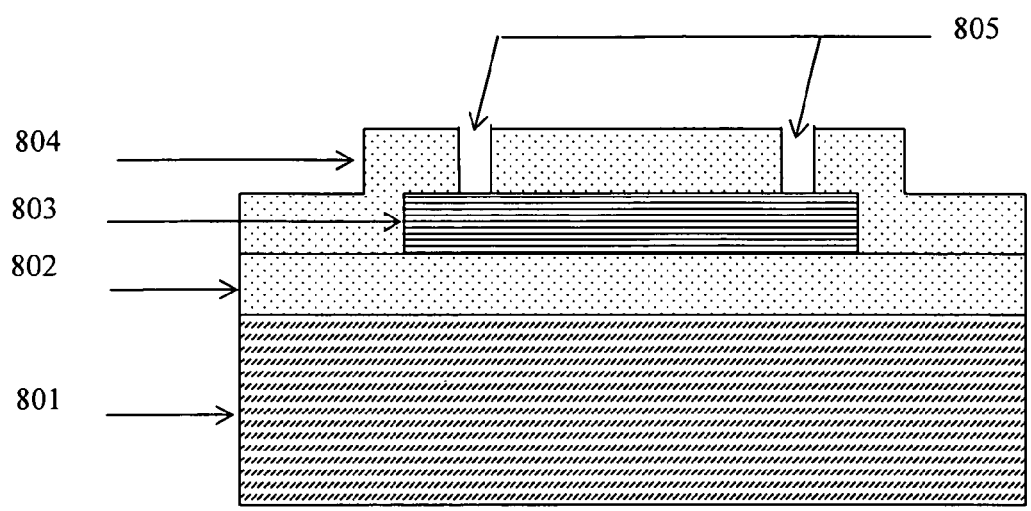

As seen in FIG. 8C, replacement windows 805 may then be opened through the gate dielectric layer 804 to expose portions of the semiconductor island 803 where source and drain are to be formed (see FIG. 8E 808 and 809) (Step S83).

Figure 8D:
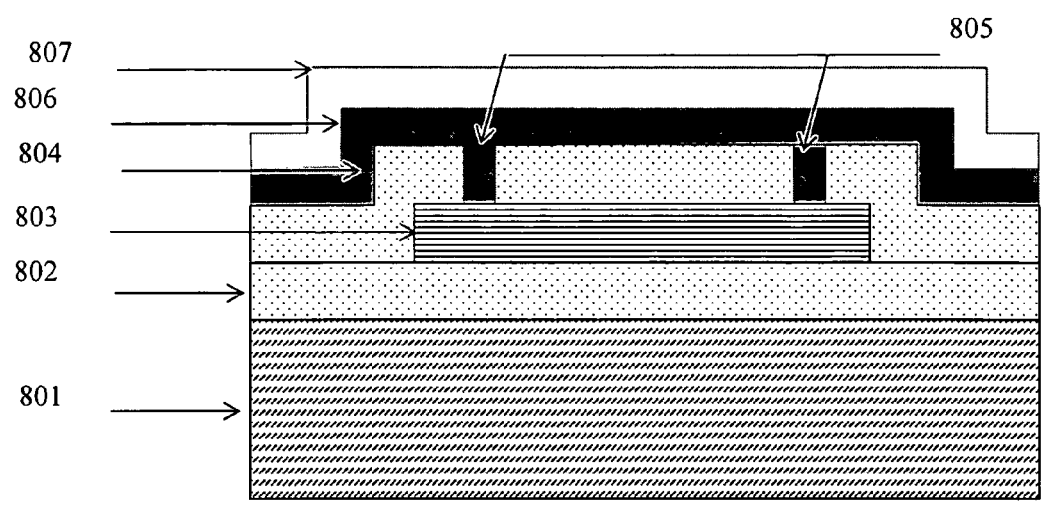
Figure 8E:
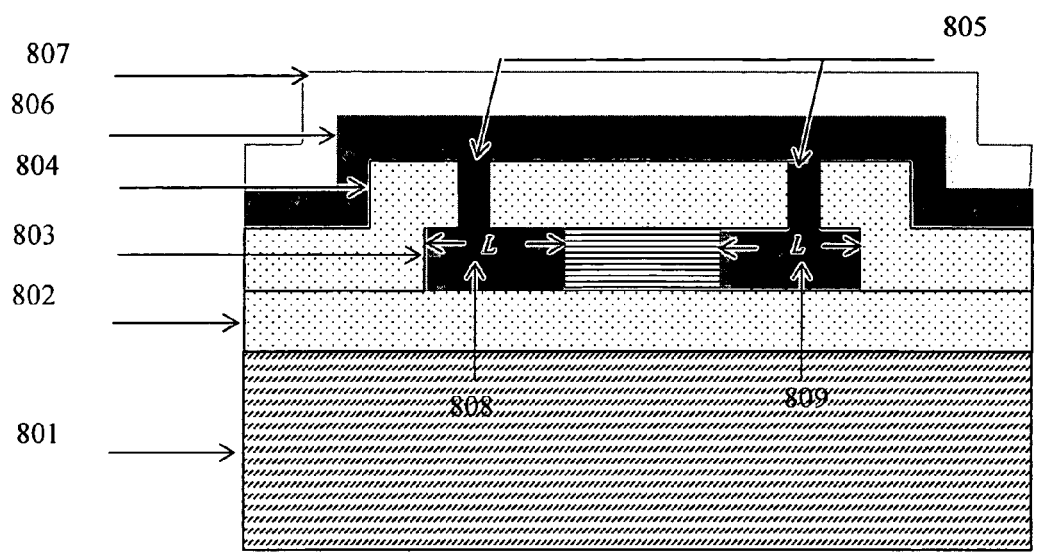

As seen in FIG. 8D, a bottom metal layer 806 may be formed over the gate dielectric layer 804 and through the replacement windows 805 (Step 84) such that the bottom metal layer 806 is in contact with the semiconductor island 803 where source and drain are to be formed (see FIG. 8E 808 and 809). A top metal layer 807 may be formed over the bottom metal layer 806 (Step S85).

As can be seen in FIG. 8E, a low-temperature (between 250-500° C.) heat-treatment process is performed wherein source 808 and drain 809 regions of the semiconductor layer 803 are replaced by the bottom metal 806 (Step S86). The lateral extent (L) of the replacement is controlled by the heat-treatment time.

Figure 8F:
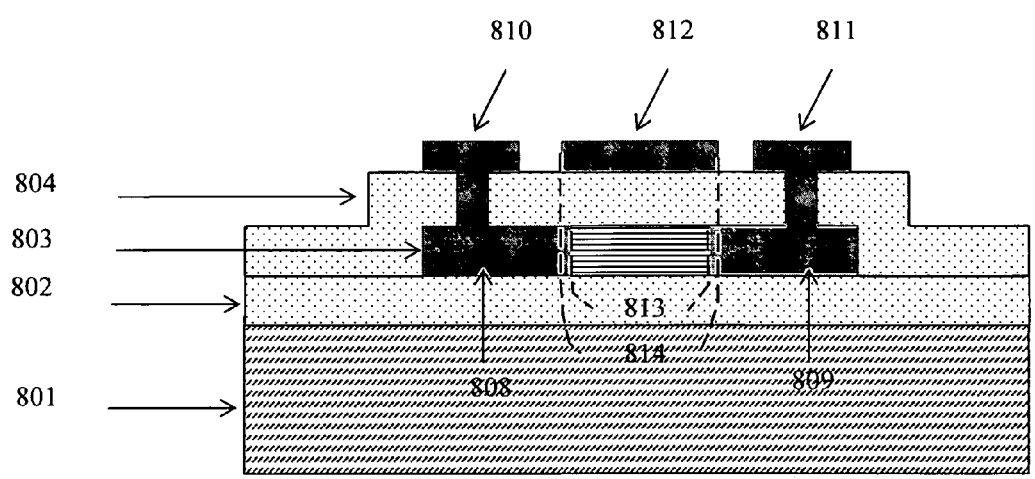

As can be seen in FIG. 8F, the top metal layer 807 may optionally be removed (Step S87). The bottom metal layer 806 may be patterned into interconnects (Step S88) to provide electrical accesses 810 and 811 to the metallic source and drain 808 and 809 respectively and an electrical access/gate electrode 812. The replacement fronts 813 should reach or slightly pass beyond the edges of the electrical access/gate electrode 812 projected downwards 814 (downward projection of edges of gate shown with broken lines).

Figure 8G:
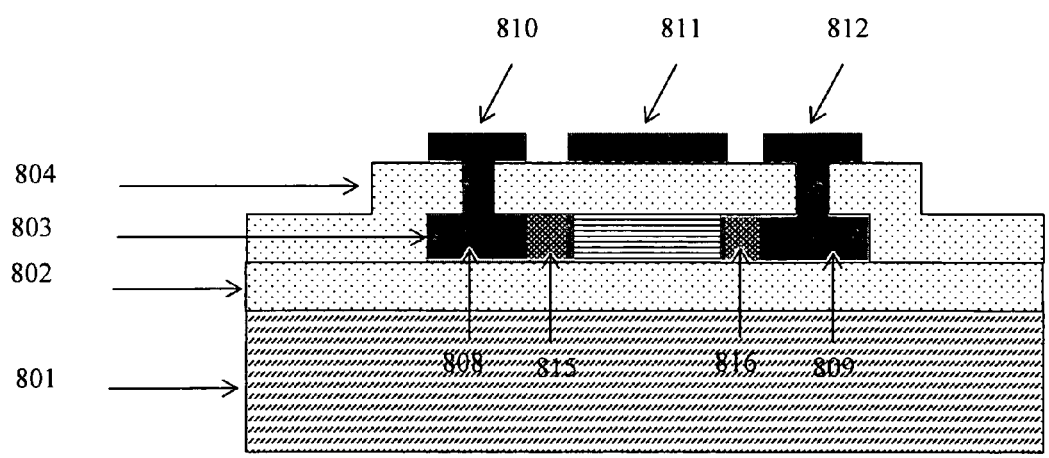

As seen in FIG. 8G, regions 815 and 816 may be formed by self-aligned introduction, such as by ion implantation, of impurities into selected regions of the semiconductor layer 803 (Step S89).

Figure 8H:
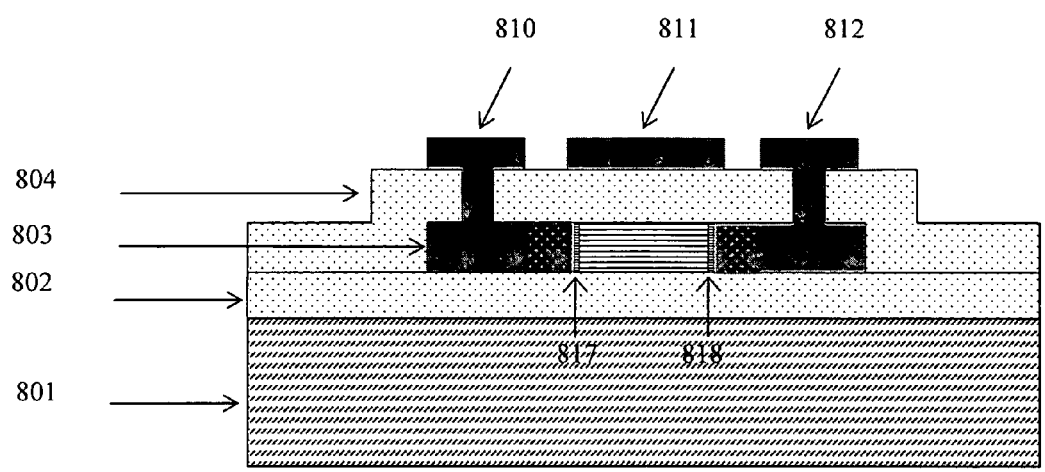

As can be seen in FIG. 8H, a low-temperature (between 250-500° C.) heat-treatment process is performed (Step S810) wherein small doped regions 817 and 818 are formed beyond the metal source and drain.

The invention has been described with reference to certain preferred embodiments thereof. It should be understood that many modifications may be made to these embodiments without departing from the spirit of the invention, which is intended to be covered by the following claims.

What is claimed is:

1. A thin-film transistor comprising a substrate; a first insulating layer disposed on the substrate; a metallic source region and a metallic drain region separated by a semiconductor channel located therebetween, wherein each metallic source region or metallic drain region is of aluminum, silver, or gold and is formed by replacing semiconductor material by metal by a low-temperature heat-treatment.

2. A thin-film inorganic transistor comprising:
a substrate;
an insulating layer disposed on the substrate;
an inorganic semiconductor island layer disposed over a portion of the insulating layer comprising source and drain regions immediately adjacent to a channel on two sides thereof wherein the source and drain regions are replaced by metal by a low-temperature heat-treatment;
a gate dielectric layer disposed on the semiconductor island layer and the insulating layer having replacement windows thereon for providing access to the semiconductor island layer;
a gate electrode disposed on a portion of the gate dielectric layer;
a metal source electrode disposed on a portion of the gate dielectric layer and in electrical contact with the source region; and
a metal drain electrode disposed on a portion of the gate dielectric layer and in electrical contact with the drain region.

3. The thin-film transistor of claim 2, wherein the substrate is comprised of a polymer, glass, quartz, stainless steel, amorphous silicon, polycrystalline silicon, single-crystalline silicon, or single-crystalline silicon containing pre-fabricated conventional integrated circuits.

4. The thin-film transistor of claim 2, wherein the insulating layer is comprised of silicon oxide, silicon oxynitride, silicon nitride, or high dielectric constant (high-k) insulating materials.

5. The thin-film transistor of claim 2, wherein the semiconductor island layer is comprised of silicon (Si), silicon-germanium alloy ($Si_xGe_{1-x}$), germanium (Ge) in the amorphous, polycrystalline, or single crystalline state, or combinations of Si, $Si_xGe_{1-x}$ or Ge layers in the amorphous, polycrystalline or single crystalline states.

6. The thin-film transistor of claim 2, wherein a front of replacement for the replacement of the source and drain regions with metal extends beyond the edges of the gate electrode projected downwards.

7. The thin-film transistor of claim 2, wherein the source and the drain metal electrodes are of aluminum, silver, or gold.

8. The thin-film transistor of claim 2, wherein the gate dielectric layer is comprised of silicon dioxide, silicon oxynitride, silicon nitride, or high dielectric constant (high-k) insulating materials.

9. A thin-film transistor comprising:
a substrate;
an insulating layer disposed on the substrate;
an inorganic semiconductor island layer disposed over a portion of the insulating layer comprising a source region, a first doped region proximate to the source region, a drain region, and a second doped region proximate to the drain region, wherein the source region, a portion of the first doped region, the drain region, and a portion of the second doped region are replaced by metal by a low-temperature heat treatment;
a gate dielectric layer disposed on the semiconductor island layer and the insulating layer having contact windows thereon for providing access to the semiconductor island layer;
a gate electrode disposed on a portion of the gate dielectric layer;
a metal source electrode disposed on a portion of the gate dielectric layer and in electrical contact with the source region; and
a metal drain electrode disposed on a portion of the gate dielectric layer and in electrical contact with the drain region.

10. The thin-film transistor of claim 9, wherein the substrate is comprised of a polymer, glass, quartz, stainless steel, amorphous silicon, polycrystalline silicon, single-crystalline silicon, or single-crystalline silicon containing pre-fabricated conventional integrated circuits.

11. The thin-film transistor of claim 9, wherein the insulating layer is comprised of silicon oxide, silicon oxynitride, silicon nitride, or high dielectric constant (high-k) insulating materials.

12. The thin-film transistor of claim 9, wherein the semiconductor island layer is comprised of silicon (Si), silicon-germanium alloy ($Si_xGe_{1-x}$), germanium (Ge) in the amorphous, polycrystalline, or single crystalline state, or combinations of Si, $Si_xGe_{1-x}$ or Ge layers in the amorphous, polycrystalline or single crystalline states.

13. The thin-film transistor of claim 9, wherein a front of replacement for the replacement of the source and drain regions with metal falls short of the edges of the gate projected downwards, ends at the edges of the gate projected downwards, or extends beyond the edges of the gate electrode projected downwards.

14. The thin-film transistor of claim 9, wherein the metal is aluminum, silver, or gold.

15. The thin-film transistor of claim 9, wherein the gate dielectric layer is comprised of silicon dioxide, silicon oxynitride, silicon nitride, or high dielectric constant (high-k) insulating materials.

* * * * *